(12) United States Patent
Okabe et al.

(10) Patent No.: US 8,884,329 B2
(45) Date of Patent: Nov. 11, 2014

(54) SEMICONDUCTOR LIGHT-EMITTING ELEMENT, ELECTRODE STRUCTURE AND LIGHT-EMITTING DEVICE

(75) Inventors: Takehiko Okabe, Ichihara (JP); Daisuke Hiraiwa, Ichihara (JP); Mamoru Kitsukawa, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 264 days.

(21) Appl. No.: 13/451,192

(22) Filed: Apr. 19, 2012

(65) Prior Publication Data
US 2012/0267673 A1    Oct. 25, 2012

(30) Foreign Application Priority Data

Apr. 20, 2011 (JP) ................ 2011-094135

(51) Int. Cl.
*H01L 33/00* (2010.01)
*H01L 33/40* (2010.01)

(52) U.S. Cl.
CPC ......... *H01L 33/40* (2013.01); *H01L 2933/0016* (2013.01); *H01L 2224/48091* (2013.01); *H01L 2224/48247* (2013.01); *H01L 2224/48257* (2013.01); *H01L 2224/49107* (2013.01)
USPC ............................. 257/99; 257/79

(58) Field of Classification Search
USPC ................ 257/79, 98, 99, 737, 738, 743, 745
See application file for complete search history.

(56) References Cited

U.S. PATENT DOCUMENTS

| | | | |
|---|---|---|---|
| 4,424,527 A * | 1/1984 | Rao et al. | 257/786 |
| 2005/0156188 A1 | 7/2005 | Ro et al. | |
| 2006/0202217 A1 | 9/2006 | Ro et al. | |
| 2009/0173962 A1* | 7/2009 | Hanawa et al. | 257/99 |

FOREIGN PATENT DOCUMENTS

| | | |
|---|---|---|
| JP | 11-203660 A | 7/1999 |
| JP | 2004-319672 A | 11/2004 |
| JP | 2005-210050 A | 8/2005 |

* cited by examiner

*Primary Examiner* — Errol Fernandes
(74) *Attorney, Agent, or Firm* — Sughrue Mion, PLLC

(57) ABSTRACT

It is an object to improve joining properties of electrodes and reliability of the electrodes for supplying electrical power to a semiconductor. The semiconductor light-emitting element includes an n-type semiconductor layer, a light-emitting layer, a p-type semiconductor layer, a transparent conductive layer, a p-electrode formed on the transparent conductive layer and an n-electrode formed on the n-type semiconductor layer. The p-electrode includes a p-side second metal layer composed of a metallic material containing Au and provided to be exposed to the outside and a p-side first metal layer composed of a metallic material containing Au with hardness higher than that of the metallic material composing the p-side second metal layer, the p-side first metal layer being provided closer to the transparent conductive layer than the p-side second metal layer along the p-side second metal layer.

15 Claims, 8 Drawing Sheets

FIG. 6

| TEST PIECE | FIRST METAL LAYER | | | | SECOND METAL LAYER | | | |
|---|---|---|---|---|---|---|---|---|
| | METAL | LAYER FORMATION METHOD | Ar GAS PRESSURE (Pa) | THICKNESS (nm) | METAL | LAYER FORMATION METHOD | Ar GAS PRESSURE (Pa) | THICKNESS (nm) |
| EXAMPLE 1 | Au | SPUTTERING | 0.3 | 1000 | Au | SPUTTERING | 2.3 | 100 |
| EXAMPLE 2 | Au | SPUTTERING | 0.3 | 1000 | Au | SPUTTERING | 3.3 | 100 |
| EXAMPLE 3 | Au | SPUTTERING | 0.3 | 1000 | Au | SPUTTERING | 4.3 | 100 |
| EXAMPLE 4 | Au | SPUTTERING | 0.3 | 1000 | Au | VAPOR DEPOSITION | - | 100 |
| EXAMPLE 5 | Au | SPUTTERING | 0.3 | 800 | Au | SPUTTERING | 2.3 | 300 |
| EXAMPLE 6 | Au | SPUTTERING | 0.3 | 800 | Au | SPUTTERING | 3.3 | 300 |
| EXAMPLE 7 | Au | SPUTTERING | 0.3 | 800 | Au | SPUTTERING | 4.3 | 300 |
| EXAMPLE 8 | Au | SPUTTERING | 0.3 | 800 | Au | VAPOR DEPOSITION | - | 300 |
| EXAMPLE 9 | Au | SPUTTERING | 0.3 | 1100 | Au | SPUTTERING | 8.3 | 300 |
| COMPARATIVE EXAMPLE 1 | Au | SPUTTERING | 0.3 | 1100 | - | - | - | - |
| COMPARATIVE EXAMPLE 2 | Au | SPUTTERING | 2.3 | 1100 | - | - | - | - |
| COMPARATIVE EXAMPLE 3 | Au | VAPOR DEPOSITION | - | 1100 | - | - | - | - |
| COMPARATIVE EXAMPLE 4 | Au | SPUTTERING | 8.3 | 1100 | - | - | - | - |

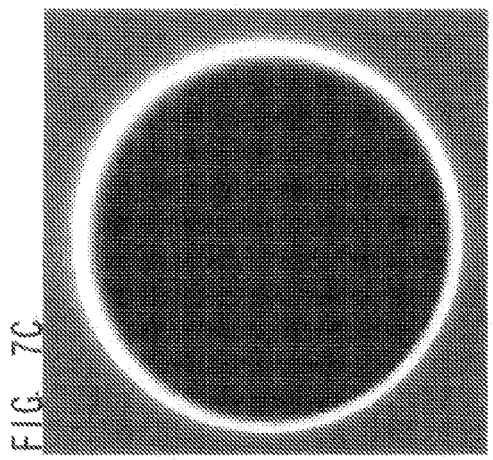
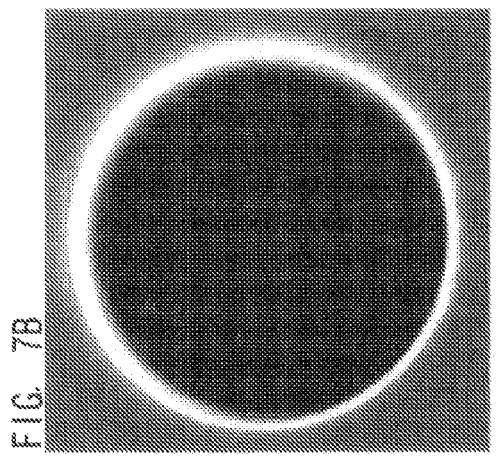 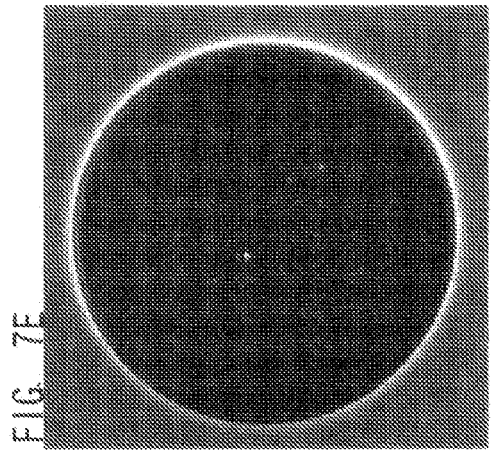
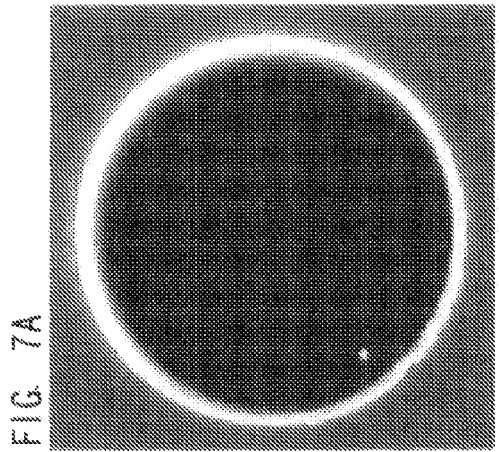 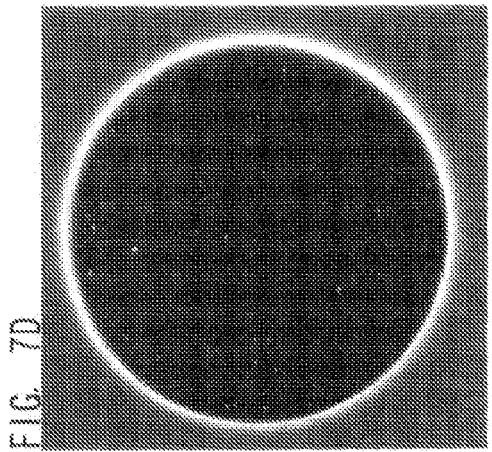

FIG. 8

| TEST PIECE | SURFACE VISUAL INSPECTION | AFM EVALUATION | | WIRE BONDING EVALUATION |
|---|---|---|---|---|
| | | DENT DEPTH (nm) | ROUGHNESS (nm) | POOR ADHESION RATE |
| EXAMPLE 1 | A | 87 | 3.0 | 0% |
| EXAMPLE 2 | A | 95 | 3.2 | 0% |
| EXAMPLE 3 | A | 101 | 3.1 | 0% |
| EXAMPLE 4 | A | 75 | 3.5 | 0% |
| EXAMPLE 5 | A | 86 | 3.1 | 0% |
| EXAMPLE 6 | A | 96 | 2.9 | 0% |
| EXAMPLE 7 | A | 105 | 3.3 | 0% |
| EXAMPLE 8 | A | 77 | 3.4 | 0% |
| EXAMPLE 9 | B | 112 | 2.6 | 0% |
| COMPARATIVE EXAMPLE 1 | A | 37 | 2.3 | 2.0% |
| COMPARATIVE EXAMPLE 2 | B | 86 | 7.1 | 2.5% |
| COMPARATIVE EXAMPLE 3 | B | 76 | 4.5 | 1.7% |
| COMPARATIVE EXAMPLE 4 | C | 119 | 2.2 | 0% |

SEMICONDUCTOR LIGHT-EMITTING ELEMENT, ELECTRODE STRUCTURE AND LIGHT-EMITTING DEVICE

CROSS REFERENCE TO RELATED APPLICATIONS

This application is based on and claims priority under 35 USC §119 from Japanese Patent Application No. 2011-094135 filed Apr. 20, 2011.

BACKGROUND

1. Technical Field

The present invention relates to a semiconductor light-emitting element, an electrode structure and a light-emitting device.

2. Related Art

The semiconductor light-emitting elements having a laminated semiconductor layer in which an n-type semiconductor layer, a light-emitting layer and a p-type semiconductor layer composed of a group III-V compound semiconductor or a group II-IV compound semiconductor are widely used.

Recently, a GaN-based compound semiconductor has become a focus of attention as a semiconductor material of the light-emitting element of short wavelength light. The GaN-based compound semiconductor is formed by a metal organic chemical vapor deposition method (MOCVD method), a molecular beam epitaxy method (MBE method) or the like on a substrate composed of a sapphire single crystal or other various oxides or group III-V compounds.

In such a semiconductor light-emitting element using the GaN-based compound semiconductor, generally, a laminated semiconductor layer having an LED structure constituted by an n-type semiconductor layer, a light-emitting layer and a p-type semiconductor layer is formed on a substrate, and while a transparent electrode and a pad electrode for bonding are formed on the p-type semiconductor layer on the top portion, another pad electrode for bonding is formed on the n-type semiconductor layer that has been exposed by removing part of the p-type semiconductor layer and the light-emitting layer by etching or the like.

As a related art, Japanese Patent Application Laid-Open Publication No. 2005-210050 describes that uppermost layers of a pad electrode on a transparent electrode layer and a pad electrode on an n-type semiconductor layer are composed of Au.

Here, generally in the case where a light-emitting device incorporating such a semiconductor light-emitting element is produced, each pad electrode is subjected to wire bonding using a known wire bonder. In the wire bonding, a bonding wire composed of Au or the like is connected to the uppermost layer of an electrode pad by applying a predetermined pressure to each electrode pad. When wire bonding is performed, there have been some cases where the pressure reaches a lower layer of the electrode pad or a transparent electrode layer or the like on which the electrode pad is laminated, and thereby separation of the electrode pad or cracks in the transparent electrode layer are caused.

It is an object of the present invention to improve joining properties of electrodes and reliability of the electrodes for supplying electrical power to a semiconductor.

SUMMARY

According to a first aspect of the present invention, a semiconductor light-emitting element includes: a first semiconductor layer that has a first conduction type; a light-emitting layer that emits light by current flow and is laminated on the first semiconductor layer; a second semiconductor layer that has a second conduction type and is laminated on the light-emitting layer; a conductive layer that has conductivity and is laminated on the second semiconductor layer; a first metal layer that is composed of a metallic material containing Au and is laminated on the conductive layer; and a second metal layer that is composed of a metallic material containing Au and having a hardness lower than a hardness of the metallic material composing the first metal layer, the second metal layer being laminated on the first metal layer so that a surface thereof opposite to another surface contacting the first metal layer is exposed to outside.

According to a second aspect of the present invention, in the semiconductor light-emitting element of the first aspect, the first metal layer and the second metal layer are composed of metallic materials having a same constituent element.

According to a third aspect of the present invention, in the semiconductor light-emitting element of the second aspect, both of the first metal layer and the second metal layer are substantially composed of Au.

According to a fourth aspect of the present invention, in the semiconductor light-emitting element of the third aspect, a thickness of the first metal layer is larger than a thickness of the second metal layer.

According to a fifth aspect of the present invention, in the semiconductor light-emitting element of the fourth aspect, the first semiconductor layer is composed of a group III nitride semiconductor in which an electron is a carrier and the second semiconductor layer is composed of a group III nitride semiconductor in which a hole is a carrier.

According to a sixth aspect of the present invention, in the semiconductor light-emitting element of the fifth aspect, the conductive layer is a transparent conductive layer that has transparency to the light emitted by the light-emitting layer and is laminated on the second semiconductor layer.

According to a seventh aspect of the present invention, in the semiconductor light-emitting element of the sixth aspect, a third metal layer composed of a metallic material having a hardness higher than a hardness of the metallic material composing the first metal layer is laminated between the transparent conductive layer and the first metal layer.

According to an eighth aspect of the present invention, in the semiconductor light-emitting element of the first aspect, a thickness of the first metal layer is larger than a thickness of the second metal layer.

According to a ninth aspect of the present invention, in the semiconductor light-emitting element of the first aspect, the first semiconductor layer is composed of a group III nitride semiconductor in which an electron is a carrier and the second semiconductor layer is composed of a group III nitride semiconductor in which a hole is a carrier.

According to a tenth aspect of the present invention, in the semiconductor light-emitting element of the ninth aspect, the conductive layer is a transparent conductive layer that has transparency to the light emitted by the light-emitting layer and is laminated on the second semiconductor layer.

According to an eleventh aspect of the present invention, in the semiconductor light-emitting element of the tenth aspect, a third metal layer composed of a metallic material having a hardness higher than a hardness of the metallic material composing the first metal layer is laminated between the transparent conductive layer and the first metal layer.

According to a twelfth aspect of the present invention, an electrode structure for supplying electrical power to a laminated semiconductor including a light-emitting layer that emits light by current flow includes: an external metal layer that is composed of a metallic material containing Au and is provided to be exposed to outside; and an internal metal layer that is composed of a metallic material containing Au and having a hardness higher than a hardness of the metallic material composing the external metal layer, the internal metal layer being provided closer to the light-emitting layer than the external metal layer and along the external metal layer.

According to a thirteenth aspect of the present invention, in the electrode structure of the twelfth aspect, the external metal layer and the internal metal layer are composed of metallic materials having a same composition.

According to a fourteenth aspect of the present invention, in the electrode structure of the thirteenth aspect, both of the external metal layer and the internal metal layer are substantially composed of Au.

According to a fifteenth aspect of the present invention, in the electrode structure of the fourteenth aspect, a thickness of the external metal layer is smaller than a thickness of the internal metal layer.

According to a sixteenth aspect of the present invention, in the electrode structure of the twelfth aspect, a thickness of the external metal layer is smaller than a thickness of the internal metal layer.

According to a seventeenth aspect of the present invention, a light-emitting device includes: a semiconductor light-emitting element including a first semiconductor layer that has a first conduction type, a light-emitting layer that emits light by current flow and is laminated on the first semiconductor layer, a second semiconductor layer that has a second conduction type and is laminated on the light-emitting layer, a conductive layer that has conductivity and is laminated on the second semiconductor layer, a first metal layer that is composed of a metallic material containing Au and is laminated on the conductive layer, and a second metal layer that is composed of a metallic material containing Au and having a hardness lower than a hardness of the metallic material composing the first metal layer, the second metal layer being laminated on the first metal layer so that a surface thereof opposite to another surface contacting the first metal layer is exposed to outside; a bonding wire bonded to the second metal layer of the semiconductor light-emitting element; and an electrical power supply member that supplies electrical power to the semiconductor light-emitting element through the bonding wire.

According to an eighteenth aspect of the present invention, in the light-emitting device of the seventeenth aspect, both of the first metal layer and the second metal layer are substantially composed of Au, and a thickness of the first metal layer is larger than a thickness of the second metal layer.

According to a nineteenth aspect of the present invention, in the light-emitting device of the eighteenth aspect, the semiconductor light-emitting element includes: other conductive layer that has conductivity and is laminated on the first semiconductor layer; other first metal layer that is composed of a metallic material containing Au and is laminated on the other conductive layer; and other second metal layer that is composed of a metallic material containing Au and having a hardness lower than a hardness of the metallic material composing the other first metal layer, the other second metal layer being laminated on the other first metal layer so that a surface thereof opposite to another surface contacting the other first metal layer is exposed to outside, and the light-emitting device further includes: other bonding wire bonded to the other second metal layer of the semiconductor light-emitting element; and other electrical power supply member that supplies electrical power to the semiconductor light-emitting element through the other bonding wire.

According to a twentieth aspect of the present invention, in the light-emitting device of the seventeenth aspect, the semiconductor light-emitting element includes: other conductive layer that has conductivity and is laminated on the first semiconductor layer; other first metal layer that is composed of a metallic material containing Au and is laminated on the other conductive layer; and other second metal layer that is composed of a metallic material containing Au and having a hardness lower than a hardness of the metallic material composing the other first metal layer, the other second metal layer being laminated on the other first metal layer so that a surface thereof opposite to another surface contacting the other first metal layer is exposed to outside, and the light-emitting device further includes: other bonding wire bonded to the other second metal layer of the semiconductor light-emitting element; and other electrical power supply member that supplies electrical power to the semiconductor light-emitting element through the other bonding wire.

According to the present invention, it is possible to improve joining properties of electrodes and reliability of the electrodes for supplying electrical power to a semiconductor.

BRIEF DESCRIPTION OF THE DRAWINGS

Exemplary embodiments of the present invention will be described in detail based on the following figures, wherein:

FIG. 6 is a table showing configuration of a p-side bonding layer, production conditions of the p-side bonding layer and a thickness of the p-side bonding layer in Examples 1 to 9 and Comparative examples 1 to 4;

FIGS. 7A to 7E are examples of microphotographs showing a top surface of a p-electrode in Example 1 and Comparative examples 1 to 4; and FIG. 8 is a table showing relationship among layer formation conditions of a p-side first metal layer and a p-side second metal layer, and surface visual inspection, AFM evaluation and wire bonding evaluation in Examples 1 to 9 and Comparative examples 1 to 4.

DETAILED DESCRIPTION

Figure 1:
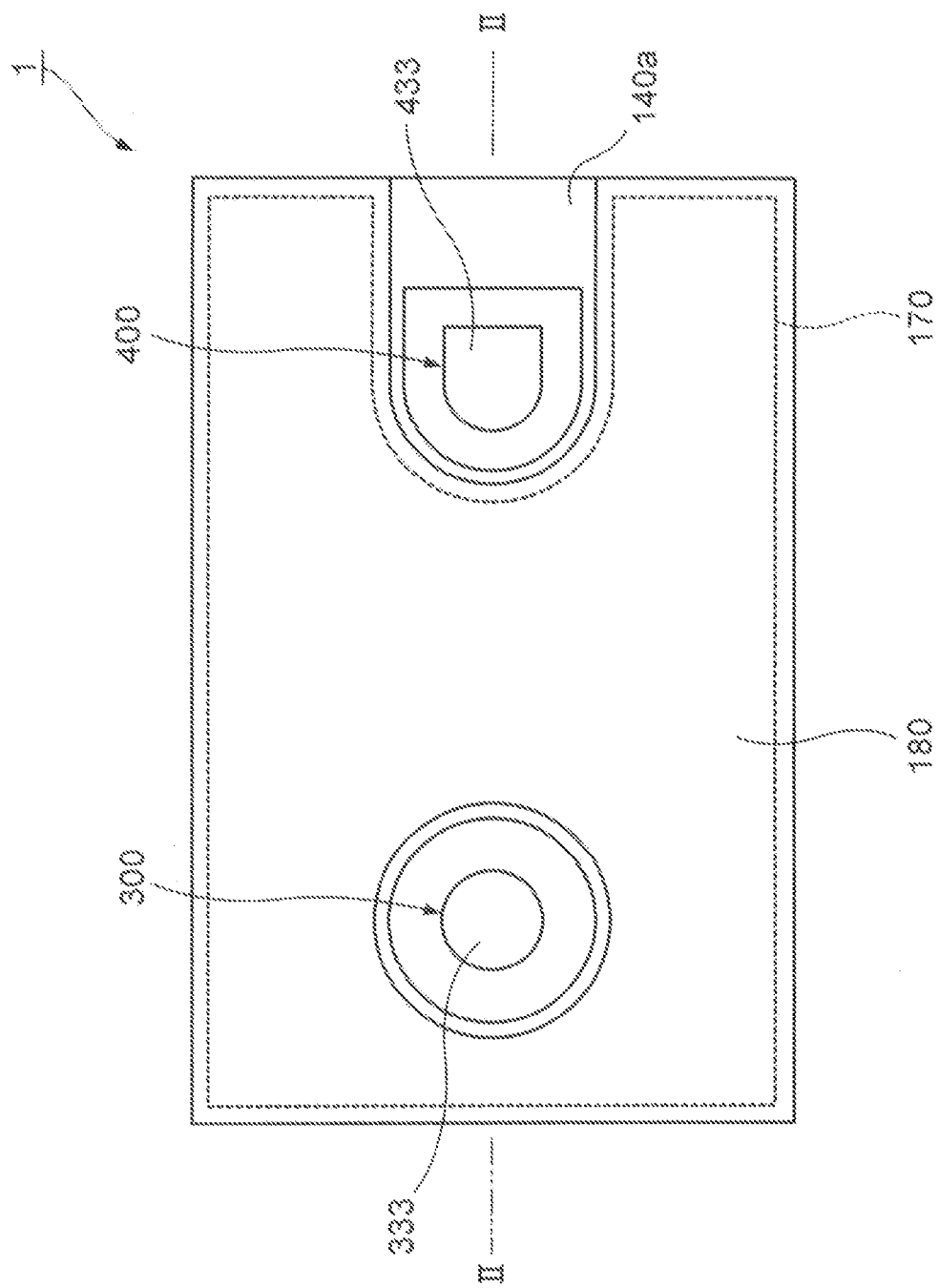
FIG. 1 is an example of a schematic plan view showing a semiconductor light-emitting element to which an exemplary embodiment is applied.

Hereinbelow, exemplary embodiments according to the present invention will be described in detail with reference to accompanying drawings. It should be noted that there are some cases where a size or a thickness of each component in the drawings that are referred to in the description below is different from a dimension of an actual semiconductor light-emitting element or the like.

[First Exemplary Embodiment]

Figure 2:
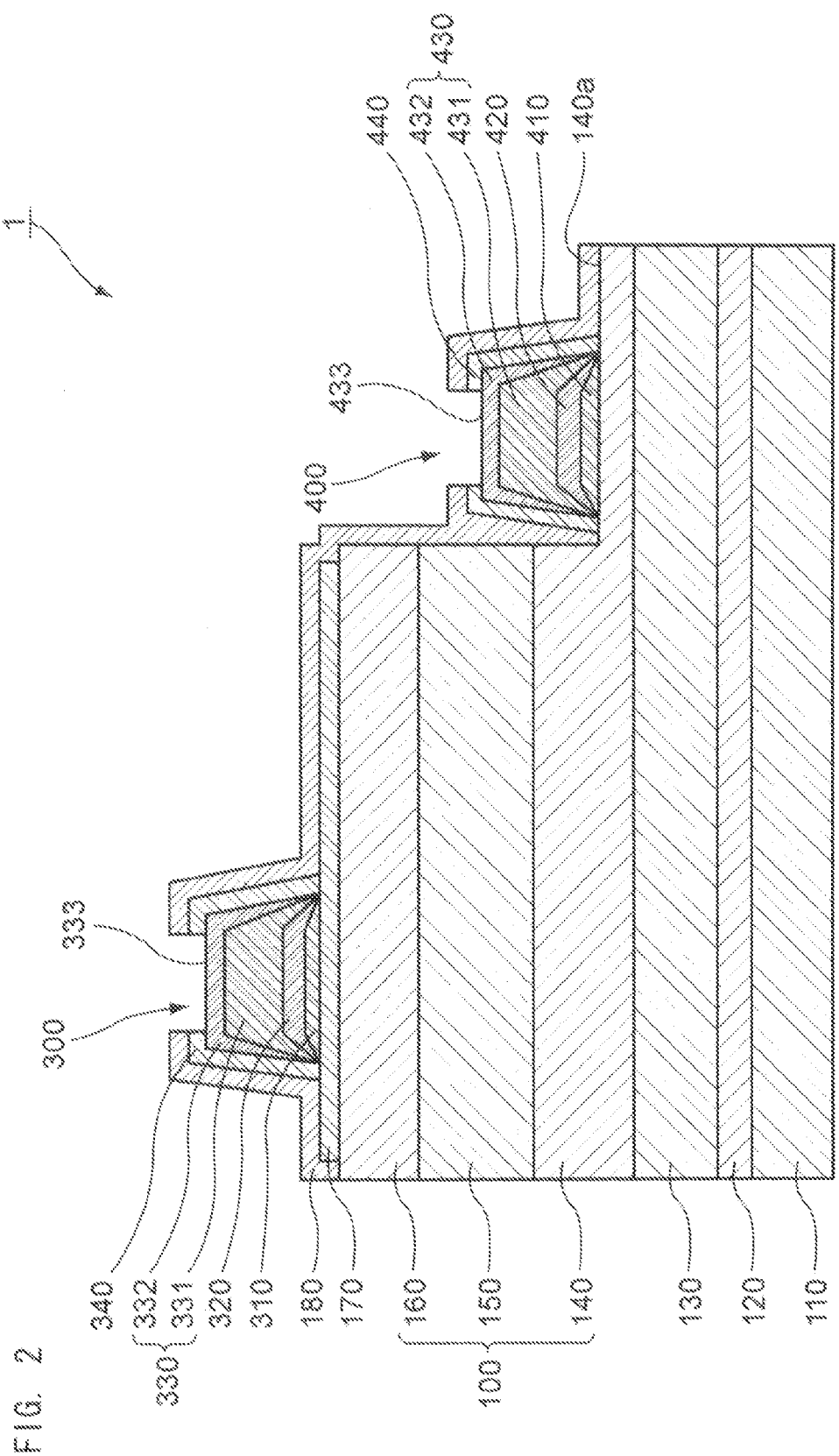
FIG. 2 is an example of a cross-sectional view showing the semiconductor light-emitting element to which the exemplary embodiment is applied.

FIG. 1 is an example of a schematic top view showing a semiconductor light-emitting element (light-emitting diode) 1 to which the first exemplary embodiment is applied, and FIG. 2 is a cross-sectional view of the semiconductor light-emitting element 1 taken along line II-II shown in FIG. 1.

(Semiconductor Light-emitting Element)

The semiconductor light-emitting element 1 of the present exemplary embodiment includes: a substrate 110; an intermediate layer 120 laminated on the substrate 110; and a base layer 130 laminated on the intermediate layer 120. The semiconductor light-emitting element 1 also includes: an n-type semiconductor layer 140 laminated on the base layer 130; a light-emitting layer 150 laminated on the n-type semiconductor layer 140; and a p-type semiconductor layer 160 laminated on the light-emitting layer 150. It should be noted that, in the following description, these n-type semiconductor layer 140, light-emitting layer 150 and p-type semiconductor layer 160 will be collectively referred to as a laminated semiconductor layer 100 as necessary.

The semiconductor light-emitting element 1 further includes a transparent conductive layer 170 laminated on the p-type semiconductor layer 160 and a p-electrode 300 laminated on a part of the transparent conductive layer 170.

Still further, the semiconductor light-emitting element 1 includes an n-electrode 400 laminated on a part of a semiconductor layer exposure surface 140a of the n-type semiconductor layer 140, which is exposed by cutting out a part of each of the p-type semiconductor layer 160, light-emitting layer 150 and n-type semiconductor layer 140.

The semiconductor light-emitting element 1 further includes a protecting layer 180 laminated to cover a region of the transparent conductive layer 170 on which the p-electrode 300 is not attached, a region of the p-electrode except for a part (a p-side connecting surface 333, which will be described later), a region of the semiconductor layer exposure surface 140a on which the n-electrode 400 is not attached, and a region of the n-electrode 400 except for a part (an n-side connecting surface 433, which will be described later). It should be noted that the protecting layer 180 also covers wall surfaces of the n-type semiconductor layer 140, the light-emitting layer 150 and the p-type semiconductor layer 160 that have been exposed by cutting out a part of each of the p-type semiconductor layer 160, the light-emitting layer 150 and the n-type semiconductor layer 140.

Moreover, the p-electrode 300 includes: a p-side joining layer 310 laminated on the transparent conductive layer 170; a p-side barrier layer 320 laminated on the p-side joining layer 310; a p-side bonding layer 330 laminated on the p-side barrier layer 320, a part of which is not covered with the protecting layer 180 to form the p-side connecting surface 333 that is thereby exposed to the outside; and a p-side adhesive layer 340 laminated on a part of the p-side bonding layer 330 except for the p-side connecting surface 333, the protecting layer 180 being laminated on a surface of the p-side adhesive layer 340 that is opposite to a surface on which the p-side bonding layer 330 is laminated. The p-side bonding layer 330 includes a p-side first metal layer 331 laminated on the p-side barrier layer 320 and a p-side second metal layer 332 laminated on the p-side first metal layer 331, on a part of which the p-side adhesive layer 340 is laminated to form the p-side connecting surface 333.

On the other hand, the n-electrode 400 includes: an n-side joining layer 410 laminated on the semiconductor layer exposure surface 140a of the n-type semiconductor layer 140; an n-side barrier layer 420 laminated on the n-side joining layer 410; an n-side bonding layer 430 laminated on the n-side barrier layer 420, a part of which is not covered with the protecting layer 180 to form the n-side connecting surface 433 that is thereby exposed to the outside; and an n-side adhesive layer 440 laminated on a part of the n-side bonding layer 430 except for the n-side connecting surface 433, the protecting layer 180 being laminated on a surface of the n-side adhesive layer 440 that is opposite to a surface on which the n-side bonding layer 430 is laminated. The n-side bonding layer 430 includes an n-side first metal layer 431 laminated on the n-side barrier layer 420 and an n-side second metal layer 432 laminated on the n-side first metal layer 431, on a part of which the n-side adhesive layer 440 is laminated to form the n-side connecting surface 433.

In the semiconductor light-emitting element 1, the light-emitting layer 150 is configured to emit light by setting the p-side bonding layer 330 in the p-electrode 300 as a positive electrode and the n-side bonding layer 430 in the n-electrode 400 as a negative electrode to pass a current from the p-electrode 300 to the n-electrode 400 through the p-side bonding layer 330 and the n-side bonding layer 430.

It should be noted that the semiconductor light-emitting element 1 is of the face-up type in which light emitted from the light-emitting layer 150 is extracted from the side on which the p-electrode 300 and the n-electrode 400 are formed.

Next, each component of the semiconductor light-emitting element 1 will be described in more detail.

<Substrate>

The substrate 110 can be selected to be used from various kinds of substrates without any limitation. For example, substrates composed of sapphire, silicon carbide, silicon, zinc oxide, magnesium oxide, manganese oxide, zirconium oxide, manganese zinc iron oxide, magnesium-aluminum oxide, zirconium boride, gallium oxide, indium oxide, lithium-gallium oxide, lithium-aluminum oxide, neodymium-gallium oxide, lanthanum-strontium-aluminum-tantalum oxide, strontium-titanium oxide, titanium oxide, hafnium oxide, tungsten oxide, molybdenum oxide and the like can be used.

Moreover, among the above-described substrates, it is particularly preferable to use the sapphire substrate whose C-plane is a principal surface. In the case where the sapphire substrate is used, the intermediate layer 120 (buffer layer) may be formed on the C-plane of the sapphire.

<Laminated Semiconductor Layer>

The laminated semiconductor layer 100 is composed of, for example, a group III nitride semiconductor, which is configured by laminating the n-type semiconductor layer 140, the light-emitting layer 150 and the p-type semiconductor layer 160 on the substrate 110 in this order as shown in FIG. 2. Here, in the n-type semiconductor layer 140, an electron is a carrier, while in the p-type semiconductor layer 160, a hole is a carrier.

Further, in addition to the n-type semiconductor layer 140, the light-emitting layer 150 and the p-type semiconductor layer 160, the base layer 130 and the intermediate layer 120 can be included into the collective term of the laminated semiconductor layer 100.

It should be noted that the laminated semiconductor layer 100 with excellent crystallinity can be obtained by forming by an MOCVD method, however, a sputtering method under optimized conditions can form a semiconductor layer having more excellent crystallinity than that formed by the MOCVD method. Hereinafter, description will be sequentially given to each layer of the laminated semiconductor layer 100.

<Intermediate Layer>

The intermediate layer 120 has a function of mediating the difference in lattice constant between the substrate 110 and the base layer 130, and especially in the case where the substrate 110 is composed of a sapphire whose C-plane is a principal surface, serves to facilitate the formation of a single crystal layer which is c-axis oriented on the (0001) surface (C-plane) of the sapphire of the substrate 110. Consequently, if a single crystal base layer 130 is laminated on the intermediate layer 120, the base layer 130 having more excellent crystallinity can be laminated. It should be noted that formation of the intermediate layer 120 is preferably carried out in the present invention, but not necessarily needed.

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be composed of, for example, polycrystal $Al_xGa_{1-x}N$ ($0 \leq x \leq 1$) with a thickness of 0.01 μm to 0.5 μm. If the thickness of the intermediate layer 120 is less than 0.01 μm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity is decreased.

<Base Layer>

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 μm or more, more preferably 0.5 μm or more, and most preferably 1 μm or more. The $Al_xGa_{1-x}N$ layer having excellent crystallinity is likely to be obtained with these layer thickness or more.

To improve the crystallinity of the base layer 130, it is desirable that the base layer 130 is not doped with impurities. However, if conductivity of p-type or n-type is needed, acceptor impurities or donor impurities can be added.

<n-type Semiconductor Layer>

The n-type semiconductor layer 140 as an example of a first semiconductor layer is preferably configured with an n-contact layer and an n-cladding layer (both not shown in the figure). It should be noted that the n-contact layer can also serve as the n-cladding layer. Further, the above-described base layer 130 may be included in the n-type semiconductor layer 140.

The n-contact layer is a layer for providing the n-electrode 400.

The n-contact layer is preferably configured with the $Al_xGa_{1-x}N$ layer ($0 \leq x < 1$, more preferably $0 \leq x \leq 0.5$, and still more preferably $0 \leq x \leq 0.1$).

Further, the n-contact layer is preferably doped with n-type impurities. It is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-electrode 400 can be maintained. As the n-type impurities, Si, Ge, Sn and so on are provided, and Si and Ge are preferably provided.

The thickness of the n-contact layer is preferably set to 0.5 μm to 5 μm, and more preferably set in a range of 1 μm to 3 μm. If the thickness of the n-contact layer is in the above-described ranges, crystallinity of the light-emitting layer 150 or the like is suitably maintained.

It is preferable to provide the n-cladding layer between the n-contact layer and the light-emitting layer 150. The n-cladding layer performs injection of the carriers into the light-emitting layer 150 and confinement of the carriers.

The n-cladding layer can be formed of AlGaN, GaN, GaInN and so on. The hetero junction structure or the superlattice structure in which the layer is laminated plural times of these structures may also be used. In the case where the n-cladding layer is formed of GaInN, the band gap thereof is preferably larger than that of GaInN of the light-emitting layer 150. It should be noted that, in this specification, AlGaN, GaN and GaInN are described with the compositional ratio of each element being omitted in some cases.

The n-type impurity concentration of the n-cladding layer is preferably in the range of $1 \times 10^{17}/cm^3$ to $1 \times 10^{20}/cm^3$, and more preferably in the range of $1 \times 10^{18}/cm^3$ to $1 \times 10^{19}/cm^3$. It is preferable to provide the impurity concentration in these ranges in terms of maintaining excellent crystallinity and reducing operation voltage of the element.

The thickness of the n-cladding layer is not particularly limited, but preferably in the range of 0.005 μm to 0.5 μm, and more preferably in the range of 0.005 μm to 0.1 μm.

It should be noted that, in the case where the n-cladding layer is a layer containing the superlattice structure, the layer may contain a structure in which an n-side first layer composed of the group III nitride semiconductor with a thickness of 10 nm or less and an n-side second layer composed of the group III nitride semiconductor having a composition different from that of the n-side first layer and having a thickness of 10 nm or less are laminated.

Further, the n-cladding layer may contain a structure in which the n-side first layers and the n-side second layers are alternately and repeatedly laminated, and in this case, the structure is preferably an alternating structure of GaInN and GaN or an alternating structure of GaInN having different compositions.

<Light-emitting Layer>

As the light-emitting layer 150 laminated on the n-type semiconductor layer 140, a single quantum well structure or a multiple quantum well structure can be employed.

As a well layer having a quantum well structure, the group III nitride semiconductor layer composed of $Ga_{1-y}In_yN$ ($0<y<0.4$) is usually used. Moreover, in the case of employing the light-emitting layer 150 having the multiple quantum well structure, the above-described $Ga_{1-y}In_yN$ is employed as the well layer, and $Al_zGa_{1-z}N$ ($0 \leq z < 0.3$) having a band gap energy larger than that of the well layer is employed as a barrier layer. The well layer and the barrier layer may be doped or not doped with impurities depending upon a design thereof.

<p-type Semiconductor Layer>

The p-type semiconductor layer 160 as an example of a second semiconductor layer is preferably configured with a p-cladding layer and a p-contact layer (both not shown in the figure). Further, the p-contact layer can also serve as the p-cladding layer.

The p-cladding layer performs confinement of carriers within the light-emitting layer 150 and injection of carriers.

The material of p-cladding layer is not particularly limited as long as the band gap energy of the composition thereof is larger than that of the light-emitting layer 150 and carriers can be confined within the light-emitting layer 150, but can be composed of, for example, $Al_xGa_{1-x}N$ ($0<x \leq 0.4$). It is preferable that the p-cladding layer is composed of such AlGaN in terms of confinement of carriers within the light-emitting layer 150.

The p-type impurity concentration of the p-cladding layer is preferably $1 \times 10^{18}/cm^3$ to $1 \times 10^{21}/cm^3$, and more preferably $1 \times 10^{19}/cm^3$ to $1 \times 10^{20}/cm^3$. If the p-type impurity concentration is in the above ranges, excellent p-type crystals can be obtained without deteriorating crystallinity.

Further, similar to the above-described n-cladding layer, the p-cladding layer may have a superlattice structure, and in this case, it is preferable to have an alternating structure of AlGaN and another AlGaN having different compositional ratio or an alternating structure of AlGaN and GaN having different composition.

The thickness of the p-cladding layer is not particularly limited, but preferably 1 nm to 400 nm, and more preferably 5 nm to 100 nm.

The p-contact layer is a layer for providing the p-electrode 300 via the transparent conductive layer 170.

The p-contact layer is preferably composed of $Al_xGa_{1-x}N$ ($0 \leq x \leq 0.4$). It is preferable that Al composition is in the above-described range in terms of allowing to maintain excellent crystallinity and good ohmic contact with the p-electrode 300.

The p-type impurity concentration is preferably $1 \times 10^{18}/cm^3$ to $1 \times 10^{21}/cm^3$, and more preferably $5 \times 10^{19}/cm^3$ to $5 \times 10^{20}/cm^3$. It is preferable that the p-type impurity concentration is in the above range in a point that it becomes possible to maintain good ohmic contact, prevent cracking and maintain excellent crystallinity. The p-type impurities are not particularly limited, but, for example, Mg is preferably provided.

The thickness of the p-contact layer is not particularly limited, but is preferably 0.01 μm to 0.5 μm, and more preferably 0.05 μm to 0.2 μm. It is preferable to provide the thickness of the p-contact layer in these ranges in terms of light emission output.

<Transparent Conductive Layer>

As shown in FIG. 2, the transparent conductive layer 170 is laminated on the p-type semiconductor layer 160. It should be noted that, in this specification, sometimes the transparent conductive layer 170 is simply described as a conductive layer.

As shown in FIG. 1, when the semiconductor light-emitting element 1 is viewed in a planar view, the transparent conductive layer 170 (refer to FIG. 1) is formed to cover almost all of the top surface of the p-type semiconductor layer 160, part of which has been removed by means of etching or the like so as to form the n-electrode 260. However, the transparent conductive layer 170 is not limited to such a shape, but may be formed in lattice patterns or tree patterns with some spaces in between. It should be noted that, as the structure of the transparent conductive layer 170, any structure including those known can be used without any limitation.

It is preferable that the transparent conductive layer 170 has a small contact resistance with the p-type semiconductor layer 160. Further, in the semiconductor light-emitting element 1 of the exemplary embodiment, since the light from the light-emitting layer 150 is extracted to the side on which the p-electrode 300 is formed, it is preferable that the transparent conductive layer 170 has excellent transparency to the light emitted from the light-emitting layer 150. Further, for uniformly passing a current over the entire surface of the p-type semiconductor layer 160, it is preferable that the transparent conductive layer 170 has excellent conductivity.

From above, as the material of the transparent conductive layer 170, it is preferable to use a conductive material having optical transparency composed of conductive oxide at least containing In. Examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

The transparent conductive layer 170 can be formed by providing these materials by any well-known method in this technical field. Moreover, there are some cases where thermal annealing is performed for improving transparency of the transparent conductive layer 170 after forming the transparent conductive layer 170.

In the present exemplary embodiment, as the transparent conductive layer 170, a crystallized structure may be used, and in particular, a transparent material containing an $In_2O_3$ crystal having a crystal structure of a hexagonal system or a bixbyite structure (for example, ITO or IZO) can be preferably used.

For instance, in the case where IZO containing the $In_2O_3$ crystal having a crystal structure of a hexagonal system is used as the transparent conductive layer 170, an amorphous IZO film that has an excellent etching property can be used and processed into a specific shape, and thereafter, processed into an electrode that is superior in optical transparency than the amorphous IZO film by transferring the amorphous state into a structure containing crystals through a heat treatment or the like. The thickness of the transparent conductive layer 170 is not particularly limited, but may be in the range of, for example, 10 nm to 500 nm.

<Protecting Layer>

The protecting layer 180 is provided to suppress entry of water or the like into the inside of the semiconductor light-emitting element 1. Further, in the present exemplary embodiment, since the light from the light-emitting layer 150 is extracted through the protecting layer 180, it is desirable that the protecting layer 180 has excellent transparency to the light emitted from the light-emitting layer 150. Accordingly, in the present exemplary embodiment, the protecting layer 180 is configured with $SiO_2$. However, the material constituting the protecting layer 180 is not limited thereto, and $TiO_2$, $Si_3N_4$, $SiO_2$—$Al_2O_3$, $Al_2O_3$, AlN or the like may be employed in place of $SiO_2$.

<p-electrode>

Next, configuration of the p-electrode 300 will be described in detail. As described above, the p-electrode 300 includes: the p-side joining layer 310; the p-side barrier layer 320; the p-side bonding layer 330 (the p-side first metal layer 331 and the p-side second metal layer 332); and the p-side adhesive layer 340. The p-electrode 300 also serves as a so-called bonding pad, and is configured so that a bonding wire not shown in the figure is connected to the p-side connecting surface 333 that is exposed to the outside.

In the specific example shown in FIG. 2, the p-electrode 300 is provided on a flat surface of the transparent conductive layer 170, however, it may be possible to form a concave portion in the transparent conductive layer 170 and provide the p-electrode 300 on a bottom surface of the concave portion. It should be noted that the p-electrode 300 can be formed anywhere on the transparent conductive layer 170. For example, the p-electrode 300 may be formed at a position away from the n-electrode 400, or may be formed at a center position of the semiconductor light-emitting element 1. However, if the p-electrode 300 is formed at a position that is too close to the n-electrode 400, it is not preferable because a short is caused between the bonding wires or bonding balls when bonding is carried out.

Moreover, in this specific example, in a planar view as shown in FIG. 1, the p-electrode 300 shows a circular shape. However, the shape is not limited thereto and it is possible to select any shape such as a polygon.

<p-side Joining Layer>

The p-side joining layer 310 is provided between the transparent conductive layer 170 and the p-side barrier layer 320 for increasing joint strength of the p-side barrier layer 320 with respect to the transparent conductive layer 170 and for ensuring ohmic contact between the transparent conductive layer 170 and the p-side barrier layer 320.

In principle, the material of the p-side joining layer 310 may be selected as appropriate from the materials having conductivity, however, those composed of at least one element selected from the group including Al, Ti, V, Cr, Mn, Co, Zn, Ge, Zr, Nb, Mo, Ru, Hf, Ta, W, Re, Rh, Ir, Ni and Pt are preferred. In particular, by employing metals such as Cr, Ti, Mo, Ni and Co, the joint strength of the p-side barrier layer 320 with respect to the transparent conductive layer 170 can be significantly increased. Moreover, materials composed of at least one element selected from the group of valve action metals such as Ti, Nb and Ta are preferred because of high resistance to corrosion by external air or water.

Further, as shown in FIG. 2, an end face portion (also referred to as a peripheral portion) of the p-side joining layer 310 is thinner than the center portion thereof, and it is desirable to select the thickness of the center portion from the range of 1 nm to 100 nm. If the thickness of the p-side joining layer 310 is less than 1 nm, in some cases, the effect of increasing joint strength of the p-side barrier layer 320 with respect to the transparent conductive layer 170 is not sufficiently obtained. On the other hand, if the thickness of the p-side joining layer 310 exceeds 100 nm, there is a possibility that the processing time for forming the p-side joining layer 310 becomes longer though there is no change to the function of the p-side joining layer 310, and accordingly the productivity is decreased.

<p-side Barrier Layer>

The p-side barrier layer 320 as an example of a third metal layer has a function of suppressing migration of elements that form the p-side joining layer 310 and a function of suppressing migration of elements (in this example, Au that will be described later) that form the p-side bonding layer 330. Further, the p-side barrier layer 320 has a role in increasing strength of the entire p-electrode 300. For this reason, it is preferable to use a relatively strong metallic material, for example, the material can be selected from any of Ag, Al, Ru, Rh, Pd, Os, Ir, Pt, Ti, W, Mo, Ni, Co, Zr, Hf, Ta and Nb, or alloys containing any of these metals. Among them, Al, Ag and Pt, and an alloy containing at least one of these metals are popular as materials for electrodes and excellent in terms of ease of availability or handling, and, Pt is especially preferred.

Moreover, as shown in FIG. 2, an end face portion (also referred to as a peripheral portion) of the p-side barrier layer 320 is thinner than the center portion thereof, and it is desirable to select the thickness of the center portion from the range of 20 nm to 500 nm. If the thickness of the p-side barrier layer 320 is less than 20 nm, it becomes difficult to obtain the effect of suppressing migration. On the other hand, making the p-side barrier layer 320 thicker than 500 nm generates no particular advantage and only results in a prolonged processing time and a waste of materials. More desirable thickness of the p-side barrier layer 320 is 50 nm to 200 nm.

Further, it is preferable that the p-side barrier layer 320 is in intimate contact with the p-side joining layer 310. To obtain sufficient strength in the entire p-electrode 300, it is necessary that the p-side barrier layer 320 is firmly joined to the transparent conductive layer 170 through the p-side joining layer 310. At the very least, it is preferable to be strong enough not to cause separation in a process of connecting a bonding wire to a bonding pad by usual methods.

<p-side Bonding Layer>

The p-side bonding layer 330 is provided for connecting the bonding wire. As shown in FIG. 2, the p-side bonding layer 330 in the present exemplary embodiment is a lamination body in which the p-side first metal layer 331 and the p-side second metal layer 332 are laminated in this order from the transparent conductive layer 170 side.

Each of the p-side first metal layer 331 and the p-side second metal layer 332 is composed of Au or an alloy containing Au. Since both of the p-side first metal layer 331 and the p-side second metal layer 332 contain Au, they can be joined to each other with high adhesive properties.

It is preferable that both of the p-side first metal layer 331 and the p-side second metal layer 332 are configured with a metallic material containing Au and having the same constituent elements in terms of adhesive properties and productivity. Further, it is more preferable that both of the p-side first metal layer 331 and the p-side second metal layer 332 contain Au and have the same constituent elements, and further have the same compositional ratio of each element. In particular, it is still more preferable that both of the p-side first metal layer 331 and the p-side second metal layer 332 are composed of Au as a single body.

<p-side First Metal Layer>

The p-side first metal layer 331 as an example of a first metal layer or an internal metal layer is provided between the p-side barrier layer 320 and the p-side second metal layer 332 for increasing joint strength of the p-side bonding layer 330 with respect to the p-side barrier layer 320 and suppressing a shock to be sent toward the p-side barrier layer 320, the shock being generated in connecting the bonding wire to the p-side connecting surface 333.

The p-side first metal layer 331 has a hardness higher than that of the p-side second metal layer 332. Further, the p-side first metal layer 331 that is formed by sputtering and has a columnar crystal structure is more preferred.

As shown in FIG. 2, an end face portion (also referred to as a peripheral portion) of the p-side first metal layer 331 is thinner than the center portion thereof, and it is desirable to select the thickness of the center portion from the range of 100 nm to 2000 nm. If the thickness of the p-side first metal layer 331 is less than 100 nm, it is not preferable because the transparent conductive layer 170 is apt to be affected by mechanical damage caused in bonding. On the other hand, if the thickness of the p-side first metal layer 331 is more than 2000 nm, the production time becomes longer and, as a result, cost is increased.

<p-side Second Metal Layer>

The p-side second metal layer 332 as an example of a second metal layer or an external metal layer has a hardness lower than that of the p-side first metal layer 331. Accordingly, in comparison with the case where the p-side second metal layer 332 has the higher hardness than the p-side first metal layer 331, it becomes possible to connect an external terminal material for electrical power supply (for example, a bonding wire) to the p-side connecting surface 333 formed on the p-side second metal layer 332 even though the pressure applied to the p-side connecting surface 333 is reduced.

Consequently, a force transmitted to the p-side barrier layer 320, p-side joining layer 310 and the transparent conductive layer 170 as the bonding is performed can be made smaller, and it becomes possible to further suppress cracks in the transparent conductive layer 170 and separation of the p-side joining layer 310 and the p-side barrier layer 320 caused by bonding.

Here, the hardness of the p-side first metal layer 331 and the p-side second metal layer 332 is obtained by nanoindentation measurement by use of an atomic force microscope (AFM). In the nanoindentation measurement, a needle is forced into a metal with a load being applied, and the hardness of the metal is determined based on the load applied to a tip end of the needle and amount of the needle forced into the metal. Since the obtained value varies depending on the shape of the needle or setting conditions of the needle with respect to the metal to be measured, evaluation of the hardness is performed with a relative value, not with an absolute value.

The p-side second metal layer 332 is, as described above, composed of Au or an alloy containing Au, and in particular, it is more preferable to be composed of Au as a single body. As the bonding wire, Au, which is excellent in electrical conductivity, ductility, corrosion resistance or the like, is often used. Accordingly, adhesive properties of the p-side second metal layer 322 to the bonding wire can be made more excellent by using Au, which has good adhesive properties to the bonding wire made of Au as a single body as the p-side second metal layer 332.

It should be noted that, in the present exemplary embodiment, the p-side second metal layer 332 is laminated along a top surface of the p-side first metal layer 331 and an inclined surface that is inclined from the top surface toward the transparent conductive layer 170 so as to cover the p-side first metal layer 331, but not limited thereto. In other words, it is sufficient to laminate the p-side second metal layer 332 at least along the top surface of the p-side first metal layer 331 so that the p-side connecting surface 333 can be formed to be connected to the external terminal material for electrical power supply.

Further, bonding operation is easily performed if the area of the p-side connecting surface 333, which is the top surface of the p-side second metal layer 332, is as large as possible, however, if the area is too large, extraction of emitted light is hindered in the case of the semiconductor light-emitting element 1 of the face-up type. For example, if the p-side connection surface 333 covers an area exceeding half of the area of a chip surface, extraction of emitted light is hindered, and thereby the output is remarkably deteriorated. On the contrary, if the area of the p-side connecting surface 333 is too small, the bonding operation becomes difficult, and there is a possibility of reducing a yield of the products.

Consequently, it is preferable that the area of the p-side connecting surface 333 is slightly larger than an area of the bonding ball including the diameter thereof, and specifically, the shape of the p-side connecting surface 333 is usually a circle with a diameter of the order of 100 μm.

Further, as shown in FIG. 2, an end face portion (also referred to as a peripheral portion) of the p-side second metal layer 332 is thinner than the center portion thereof, and it is preferable to make the thickness of the center portion thinner than that of the p-side first metal layer 331. For example, it is preferable to select the thickness of the center portion of the p-side second metal layer 332 from the range of 20 nm to 500 nm. If the thickness of the p-side second metal layer 332 is less than 20 nm, it becomes difficult to connect the bonding wire or the like to the p-side connecting surface 333 under light load. In such a case, it is necessary to apply heavy load for securely connecting the bonding wire, but it is not preferable since mechanical damage is caused to the transparent conductive layer 170 when bonding is performed. On the other hand, if the p-side second metal layer 332 is made thicker than 500 nm, the production time becomes longer and, as a result, cost is increased. It is more desirable to set the thickness of the p-side second metal layer 332 in the range of 50 nm to 300 nm.

It should be noted that the p-side second metal layer 332 can be formed by, for example, sputtering, vapor deposition or the like.

In general, in the case where smoothness of the surface of the p-side bonding layer 330 is deteriorated, it becomes difficult to perform bonding with a bonding wire without increasing the load applied in bonding. On the other hand, the lower the surface hardness of the p-side bonding layer 330, the lighter the load applied to the surface of the Au layer in bonding.

Accordingly, it is preferable to use an Au layer having regular crystal grains and smooth surfaces as the p-side first metal layer 331, use an Au layer in which crystal grains grow randomly and whose hardness is lower than that of the p-side first metal layer 331 as the p-side second metal layer 332, and make the thickness of the p-side second metal layer 332 smaller than that of the p-side first metal layer 331. Consequently, even in the case where the Au layer containing random and cluster-like crystal grains is used as the p-side second metal layer 332, degradation of smoothness of the surface of the p-side bonding layer 330 can be suppressed, and it becomes possible to securely perform bonding of the bonding wire to the p-side bonding layer 330 at light load.

Accordingly, it is desirable that the p-side first metal layer 331 is an Au layer which is formed by a sputtering method, has a regular columnar laminated structure, and has a smooth surface.

It is desirable that the p-side second metal layer 332 is an Au layer which is formed by sputtering or vapor deposition, has a hardness lower than that of the p-side first metal layer 331, and contains not regular, random, and cluster-like crystal grains. Further, it is also desirable that the p-side second metal layer 332 is thinner than the p-side first metal layer 331.

Moreover, the p-side second metal layer 332 is desirably formed by sputtering rather than vapor deposition. In the case where the p-side second metal layer 332 is formed by sputtering, after the p-side first metal layer 331 is formed by sputtering, the p-side second metal layer 332 can be continuously formed by use of the same chamber; therefore, there is an advantage in terms of productivity.

It should be noted that the method of forming the p-side first metal layer 331 and the p-side second metal layer 332 will be described in detail later.

<p-side Adhesive Layer>

The p-side adhesive layer 340 is laminated between the p-side bonding layer 330 and the protecting layer 180 for increasing joint strength of the p-side bonding layer 330 with respect to the protecting layer 180.

As in the present exemplary embodiment, in the case where the p-side bonding layer 330 is configured with Au or an alloy containing Au and the protecting layer 180 is configured with $SiO_2$, the p-side adhesive layer 340 formed in between is preferably configured with Ta. It should be noted that the p-side adhesive layer 340 may be configured with, for example, Ti, Pt, Mo, Ni or W in place of Ta.

As described above, the p-electrode 300 is configured with the p-side joining layer 310, the p-side barrier layer 320, the p-side bonding layer 330 (the p-side first metal layer 331, the p-side second metal layer 332) and the p-side adhesive layer 340.

<n-electrode>

Subsequently, configuration of the n-electrode 400 will be described in detail. As described above, the n-electrode 400 includes: the n-side joining layer 410; the n-side barrier layer 420; the n-side bonding layer 430 (the n-side first metal layer 431 and the n-side second metal layer 432); and the n-side adhesive layer 440. The n-electrode 400 also serves as a so-called bonding pad, and is configured so that a bonding wire not shown in the figure is connected to the n-side connecting surface 433 that is exposed to the outside.

It should be noted that, in this specific example, in a planar view as shown in FIG. 1, the n-electrode 400 shows a semicylindrical shape. However, similar to the p-electrode 300 as described above, it is possible to select any shape such as a circle or a polygon.

In the present exemplary embodiment, the n-electrode 400 has the same configuration as the p-electrode 300 except for the point that the n-electrode 400 is formed on the semiconductor layer exposure surface 140a of the n-type semiconductor layer 140. Accordingly, the n-side joining layer 410, the n-side barrier layer 420, the n-side first metal layer 431 and the n-side second metal layer 432 constituting the n-side bonding layer 430, the n-side adhesive layer 440 are configured with the same materials as the p-side joining layer 310, the p-side barrier layer 320, the p-side first metal layer 331 and the p-side second metal layer 332 constituting the p-side bonding layer 330 and the p-side adhesive layer 340, respectively.

It should be noted that, in the present exemplary embodiment, the p-side first metal layer 331 is laminated on the p-side barrier layer 320 and the n-side first metal layer 431 is laminated on the n-side barrier layer 420. However, any other conductive layer may be formed between the p-side barrier layer 320 and the p-side first metal layer 331, and in the same way, any other conductive layer may be formed between the n-side barrier layer 420 and the n-side first metal layer 431.

Further, in the present exemplary embodiment, the p-electrode 300 and the n-electrode 400 have the same configuration, however, it may be possible that one of the p-electrode 300 and the n-electrode 400 has the above-described configuration and the other one has a different configuration.

Moreover, in the present exemplary embodiment, description has been given to the semiconductor light-emitting element 1 of the face-up type, but the present invention is not limited thereto. For example, the present invention may be applied to a semiconductor light-emitting element of a flip-chip type.

(Method of Producing Semiconductor Light-emitting Element)

Figure 3:
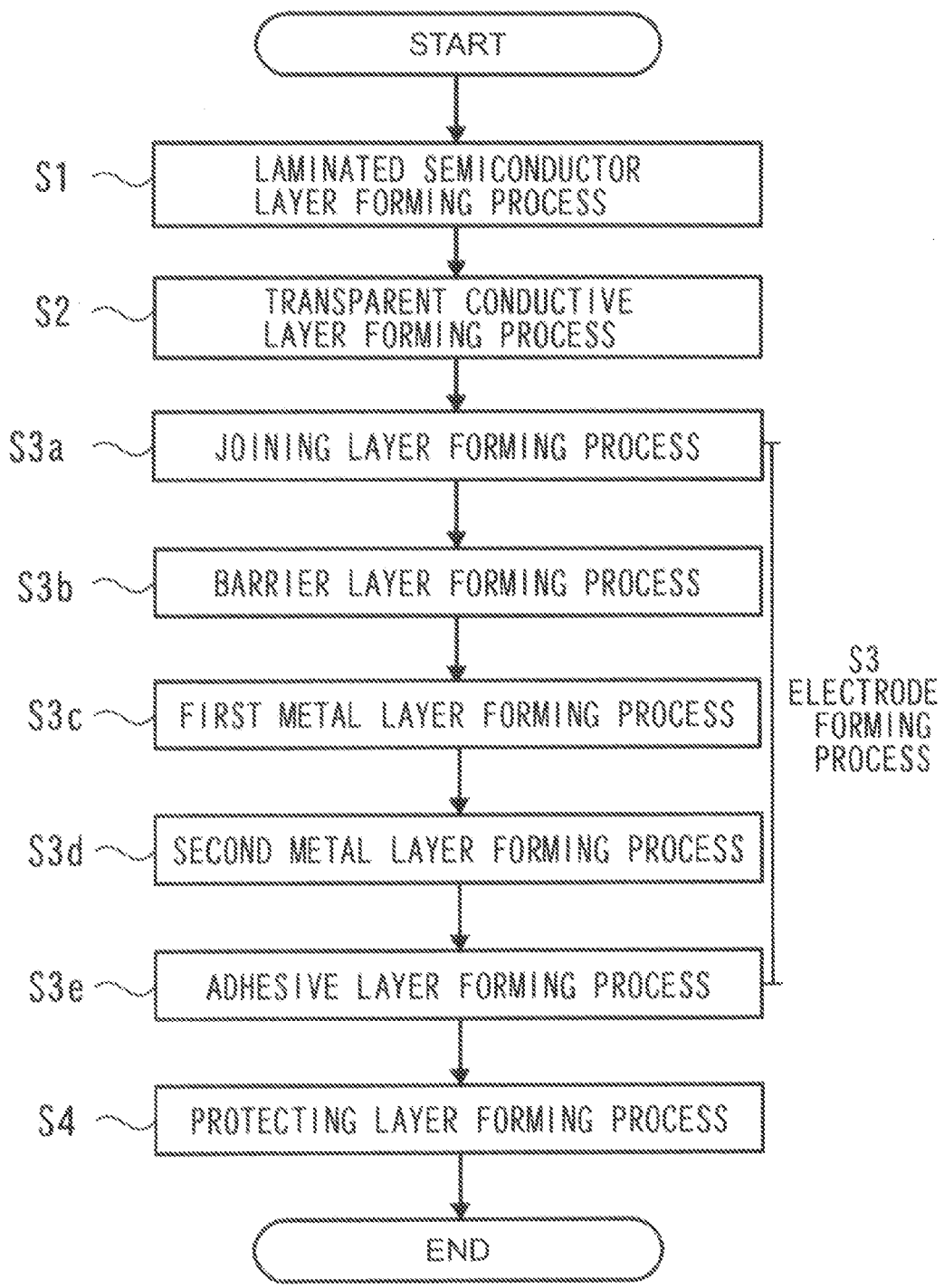
FIG. 3 is a flowchart showing an example of a method of producing the semiconductor light-emitting element.

Next, an example of a method of producing the semiconductor light-emitting element 1 shown in FIGS. 1 and 2 will be described. FIG. 3 is a flowchart showing the example of a method of producing the semiconductor light-emitting element 1.

As shown in FIG. 3, the method of producing the semiconductor light-emitting element 1 in the present exemplary embodiment includes: a laminated semiconductor layer forming process in which the laminated semiconductor layer 100 including the light-emitting layer 150 is laminated on the substrate 110, and the semiconductor layer exposure surface 140a is formed by cutting out a part of the laminated semiconductor layer 100 (step 1); a transparent conductive layer forming process in which the transparent conductive layer 170 is formed on the laminated semiconductor layer 100 (step 2); an electrode forming process in which the p-electrode 300 is formed on the transparent conductive layer 170 and the n-electrode 400 is formed on the semiconductor layer exposure surface 140a (step 3); and a protecting layer forming process in which the protecting layer 180 is formed (step 4).

The above-described electrode forming process in step 3 includes: a joining layer forming process in which the p-side joining layer 310 is formed on a part of the transparent conductive layer 170 and the n-side joining layer 410 is formed on the semiconductor layer exposure surface 140a (step 3a); a barrier layer forming process in which the p-side barrier layer 320 is formed on the p-side joining layer 310 and the n-side barrier layer 420 is formed on the n-side joining layer 410 (step 3b); a first metal layer forming process in which the p-side first metal layer 331 is formed on the p-side barrier layer 320 and the n-side first metal layer 431 is formed on the n-side barrier layer 420 (step 3c); a second metal layer forming process in which the p-side second metal layer 332 is formed on the p-side first metal layer 331 and the n-side second metal layer 432 is formed on the n-side first metal layer 431 (step 3d); and an adhesive layer forming process in which the p-side adhesive layer 340 is formed on the p-side second metal layer 332 except for the p-side connecting surface 333 and the n-side adhesive layer 440 is formed on the n-side second metal layer 432 except for the n-side connecting surface 433 (step 3e).

Moreover, in some cases, the method of producing the semiconductor light-emitting element 1, to which the present exemplary embodiment is applied, further includes an annealing process in which heat treatment is applied to the obtained semiconductor light-emitting element 1 after the adhesive layer forming process in step 3e as necessary.

Hereinafter, the above-described process of each step will be described in turn.

It should be noted that, in the following description, the p-side joining layer 310 and the n-side joining layer 410 are simply referred to as a joining layer, the p-side barrier layer 320 and the n-side barrier layer 420 are simply referred to as a barrier layer, the p-side bonding layer 330 and the n-side bonding layer 430 are simply referred to as a bonding layer, and the p-side adhesive layer 340 and the n-side adhesive layer 440 are simply referred to as an adhesive layer in some cases. Further, sometimes, the p-side first metal layer 331 and the n-side first metal layer 431 are simply referred to as a first metal layer, and the p-side second metal layer 332 and the n-side second metal layer 432 are simply referred to as a second metal layer.

<Laminated Semiconductor Layer Forming Process>

The laminated semiconductor layer forming process in step 1 will be described.

In the laminated semiconductor layer forming process, first, the substrate 110 such as a sapphire substrate is provided and is subjected to a pretreatment. The pretreatment can be carried out by, for example, placing the substrate 110 in a chamber of a sputtering device and performing sputtering on the surface of the substrate 110. Subsequent to the pretreatment, the intermediate layer 120 is formed on the substrate 110 by the sputtering method.

It should be noted that the intermediate layer 120 may be formed not only by the above-described sputtering method, but also by an MOCVD method.

Subsequently, after the intermediate layer 120 is formed, the single-crystal base layer 130 is formed on the substrate 110 on which the intermediate layer 120 has been formed. The base layer 130 may be formed by the sputtering method or by the MOCVD method.

After the base layer 130 is formed, the n-type semiconductor layer 140 is formed by laminating the n-contact layer and the n-cladding layer. The n-contact layer and the n-cladding layer may be formed by the sputtering method or by the MOCVD method.

After the n-type semiconductor layer 140 is formed, the light-emitting layer 150 is formed on the top surface of the n-type semiconductor layer 140. The method of forming the light-emitting layer 150 may be any of the sputtering method and the MOCVD method, but in particular, it is preferable to form the light-emitting layer 150 by the MOCVD method. Specifically, the barrier layers and the well layers may be alternately and repeatedly laminated such that the barrier layers are located to face the n-type semiconductor layer 140 and the p-type semiconductor layer 160.

After the light-emitting layer 150 is formed, the p-cladding layer and the p-contact layer are laminated in order to form the p-type semiconductor layer 160. The p-cladding layer and the p-contact layer may be formed by the sputtering method or by the MOCVD method.

Subsequently, prior to forming the transparent conductive layer 170, a part of the contact layer of the n-type semiconductor layer 140 is exposed by performing patterning by a known method of photolithography and performing etching of a part of the laminated semiconductor layer 100 in a predetermined region, and thereby the semiconductor layer exposure surface 140a is formed.

<Transparent Conductive Layer Forming Process>

Next, the transparent conductive layer forming process in step 2 will be described.

In the transparent conductive layer forming process, the transparent conductive layer 170 is formed by use of a known method such as the sputtering method on the p-type semiconductor layer 160, which is not removed by etching to be left, while covering the semiconductor layer exposure surface 140a with a mask or the like. It should be noted that the semiconductor layer exposure surface 140a may be formed by, after the transparent conductive layer 170 is formed on the p-type semiconductor layer 160 in advance, removing a part of the laminated semiconductor layer 100 as well as a part of the transparent conductive layer 170 by etching.

<Electrode Forming Process>

Subsequently, the electrode forming process in step 3 will be described. In the present exemplary embodiment, the formation of the p-electrode 300 and the formation of the n-electrode 400 are conducted at the same time.

The electrode forming process includes the joining layer forming process in step 3a, the barrier layer forming process in step 3b, the first metal layer forming process in step 3c, the second metal layer forming process in step 3d and the adhesive layer forming process in step 3e.

<Joining Layer Forming Process>

In the joining layer forming process, first, a mask is formed in which opening portions are provided at positions corresponding to a region of the transparent conductive layer 170 where the p-electrode 300 is to be formed and a region of the semiconductor layer exposure surface 140a where the n-electrode 400 is to be formed.

Subsequently, by the sputtering method, the p-side joining layer 310 is formed on the transparent conductive layer 170 and the n-side joining layer 410 is formed on the semiconductor layer exposure surface 140a, the transparent conductive layer 170 and the semiconductor layer exposure surface 140a being exposed at the opening portions. At this time, by using a sputtering method with controlled sputtering conditions, the p-side joining layer 310 and the n-side joining layer 410 can be formed with increased coverage properties irrespective of a material for sputtering. In the present exemplary embodiment, Ta is used as the sputtering target, and sputtering is performed under an Ar gas atmosphere.

<Barrier Layer Forming Process>

Subsequently, the p-side barrier layer 320 is formed on the p-side joining layer 310 and the n-side barrier layer 420 is formed on the n-side joining layer 410 by the sputtering method. At this time, by using a sputtering method with controlled sputtering conditions, the p-side barrier layer 320 and the n-side barrier layer 420 can be formed with increased coverage properties irrespective of a material for sputtering. In the present exemplary embodiment, Pt is used as the sputtering target, and sputtering is performed under an Ar gas atmosphere.

<First Metal Layer Forming Process>

Subsequently, the p-side first metal layer 331 and the n-side first metal layer 431 are formed.

In the present exemplary embodiment, the p-side first metal layer 331 and the n-side first metal layer 431, and the p-side second metal layer 332 and the n-side second metal layer 432 are formed of Au. Accordingly, a single sputtering target can be shared by the first metal layer forming process and the second metal layer forming process. In other words, it is unnecessary to change the sputtering target between the first metal layer forming process and the second metal layer forming process, and thereby continuous processing becomes possible.

In the first metal layer forming process, the p-side first metal layer 331 is formed on the p-side barrier layer 320 and the n-side first metal layer 431 is formed on the n-side barrier layer 420. In the present exemplary embodiment, Au is used as the sputtering target, and sputtering is performed under the Ar gas atmosphere.

Further, in the first metal layer forming process, the gas pressure in the chamber of the sputtering device is set to a first pressure.

<Second Metal Layer Forming Process>

Subsequently, the p-side second metal layer 332 is formed on the p-side first metal layer 331 and the n-side second metal layer 432 is formed on the n-side first metal layer 431.

As described above, in the present exemplary embodiment, Au used in the first metal layer forming process is continuously used as the sputtering target in the second metal layer forming process, and similar to the first metal layer forming process, sputtering is performed under the Ar gas atmosphere.

In the second metal layer forming process, sputtering is performed with sputtering conditions different from those in the first metal layer forming process. In the present exemplary embodiment, the sputtering conditions are changed so that the gas pressure in the chamber of the sputtering device is set to a second pressure that is higher than the first pressure.

Consequently, the p-side second metal layer 332 is formed to have a low hardness compared to the p-side first metal layer 331, and the n-side second metal layer 432 is formed to have a low hardness compared to the n-side first metal layer 431.

In the present exemplary embodiment, in the second metal layer forming process, the p-side second metal layer 332 is formed to be thinner than the p-side first metal layer 331, and the n-side second metal layer 432 is formed to be thinner than the n-side first metal layer 431.

Since, in the second metal layer forming process, the gas pressure in the chamber of the sputtering device is increased in comparison with the first metal layer forming process, the laminating speed of Au is reduced compared to the first metal layer forming process. Accordingly, it is possible to increase productivity by forming the p-side second metal layer 332 to be thinner than the p-side first metal layer 331 and forming the n-side second metal layer 432 to be thinner than the n-side first metal layer 431 compared to the case where the p-side second metal layer 332 is formed to be thicker than the p-side first metal layer 331 and the n-side second metal layer 432 is formed to be thicker than the n-side first metal layer 431.

It should be noted that, in the present exemplary embodiment, the gas pressure in the chamber of the sputtering device is changed between the first metal layer forming process and the second metal layer forming process, however, a way to change the sputtering conditions is not limited thereto. For example, the first metal layer and the second metal layer may be formed so that the hardness of the second metal layer becomes lower than that of the first metal layer by changing sputtering conditions between the first metal layer forming process and the second metal layer forming process such as heating temperature of the substrate 110 and the applied voltage in performing sputtering.

<Adhesive Layer Forming Process>

Subsequently, by using a known method such as the sputtering method, the p-side adhesive layer 340 is formed on the p-side second metal layer 332 and the n-side adhesive layer 440 is formed on the n-side second metal layer 432. In the case where the p-side adhesive layer 340 and the n-side adhesive layer 440 are formed by the sputtering method, sputtering may be performed by use of Ta as the sputtering target under the Ar gas atmosphere.

<Protecting Layer Forming Process>

Subsequently, the protecting layer forming process in step 4 will be described.

In the protecting layer forming process, the protecting layer 180 composed of $SiO_2$ is formed by the sputtering method on the region where the transparent conductive layer 170, the p-electrode 300 and the n-electrode 400, and the semiconductor layer exposure surface 140a is formed.

Then, the region except for the portions where the p-side connecting surface 333 and the n-side connecting surface 433 are formed is covered with a mask, and etching is performed on the protecting layer 180 and the adhesive layer (the p-side adhesive layer 340 and the n-side adhesive layer 440) existing at these portions to expose a part of each of the p-side second metal layer 332 and the n-side second metal layer 432. Accordingly, the p-side second metal layer 332 except for the p-side connecting surface 333 is covered with the p-side adhesive layer 340 and the protecting layer 180 and the p-side connecting surface 333 is exposed at the center portion of the p-side adhesive layer 340, and the n-side second metal layer 432 except for the n-side connecting surface 433 is covered with the n-side adhesive layer 440 and the protecting layer 180 and the n-side connecting surface 433 is exposed at the center portion of the n-side adhesive layer 440.

<Heat Annealing Process>

Thereafter, the semiconductor light-emitting element 1 thus obtained is subjected to an annealing process in the temperature range of 150° C. or more to 600° C. or less, more preferably, 200° C. or more to 500° C. or less under a reducing atmosphere of, for example, nitrogen. The heat annealing process is conducted for increasing the adhesive properties between the transparent conductive layer 170 and the p-side barrier layer 320 with the p-side joining layer 310 interposed therebetween and the adhesive properties between the semiconductor layer exposure surface 140a and the n-side barrier layer 420 with the n-side joining layer 410 interposed therebetween.

Further, surface roughness of the p-side connecting surface 333 and the n-side connecting surface 433 can be reduced by performing the heat annealing process. Consequently, it becomes possible to perform bonding of the bonding wire to the p-side connecting surface 333 or the n-side connecting surface 433 at a light load in comparison with the case where the heat annealing process is not performed.

It should be noted that the heat annealing process may be performed after the adhesive layer forming process is executed and before the protecting layer forming process is performed.

According to the above processes, the semiconductor light-emitting element 1 is obtained.

Figure 4:
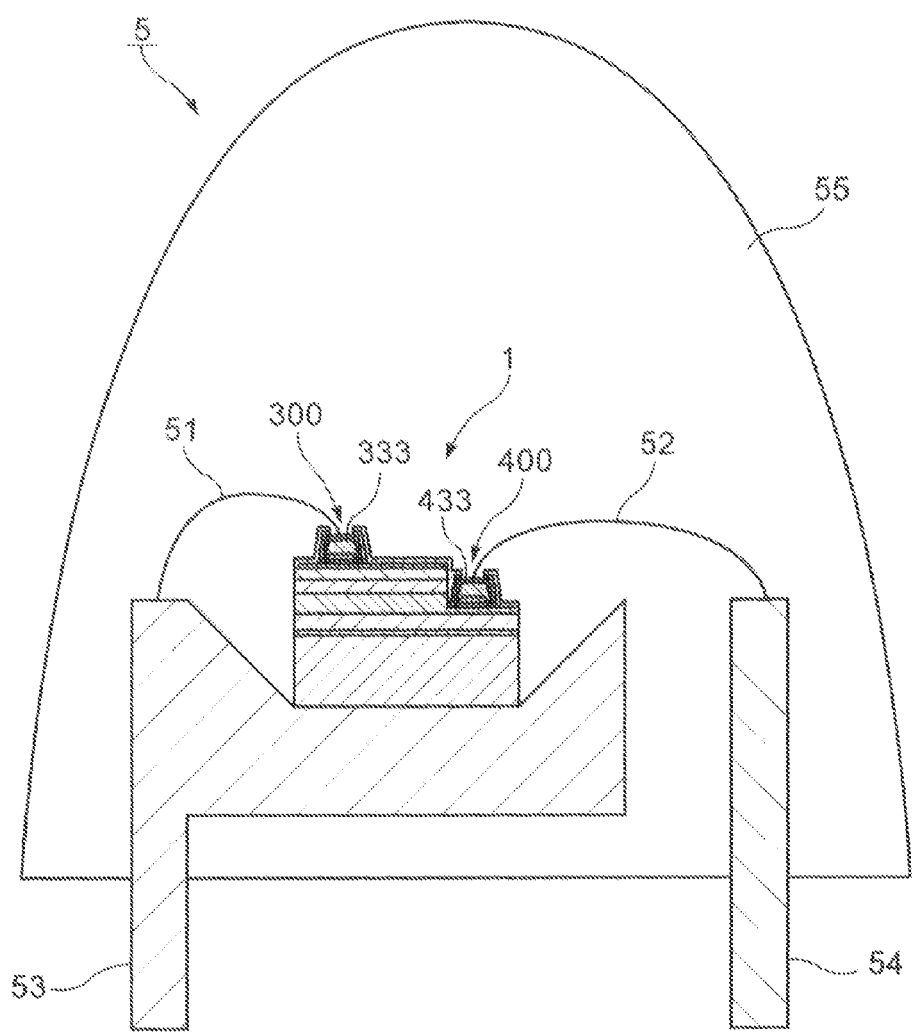
FIG. 4 is an example of a cross-sectional view showing a light-emitting device to which the semiconductor light-emitting element of the exemplary embodiment is applied.

FIG. 4 is an example of a cross-sectional view showing a light-emitting device to which the semiconductor light-emitting element 1 of the present exemplary embodiment is applied. As shown in FIG. 4, a light-emitting device 5 is of a shell-type, to which the semiconductor light-emitting element 1 is mounted. It should be noted that the light-emitting device 5 is formed by combining, for example, the light-emitting element 1 and a phosphor, and can be formed by a method known to those skilled in the art to have a configuration known to those skilled in the art. Further, there is known a technique that changes light emission color by combining the semiconductor light-emitting element 1 and a phosphor, and it is possible to adopt such a technique into the light-emitting device 5 without any limitation.

As shown in FIG. 4, the light-emitting device 5 includes: a p-side frame 53 that is connected to the p-electrode 300 of the semiconductor light-emitting element 1 via a p-side bonding wire 51; an n-side frame 54 that is connected to the n-electrode 400 of the semiconductor light-emitting element 1 via an n-side bonding wire 52; and a mold 55 composed of a transparent resin and formed to enclose the periphery of the semiconductor light-emitting element 1.

The light-emitting device 5 includes the semiconductor light-emitting element 1 of the present exemplary embodiment having the p-electrode 300 with excellent adhesive properties with the p-side bonding wire 51 and the n-electrode 400 with excellent adhesive properties with the n-side bonding wire 52. Accordingly, the light-emitting device 5 is excellent in durability and can be produced with good yield.

As shown in FIGS. 2 and 4, the semiconductor light-emitting element 1 of the present exemplary embodiment is applied to the light-emitting device 5 by, after die-bonding of the semiconductor light-emitting element 1 on the substrate 110 side to the p-side frame 53 as a base stage, the p-side bonding wire 51 formed of Au is connected to the p-side connecting surface 333 formed on the p-side second metal layer 332 of the p-side bonding layer 330 in the p-electrode 300 via a bonding ball formed of Au. Here, the bonding is performed by applying heat, load, and ultrasonic to the p-side connecting surface 333 and the p-side bonding wire 51. In the same way, the n-side bonding wire 52 formed of Au is connected to the n-side connecting surface 433 formed on the n-side second metal layer 432 of the n-side bonding layer 430 in the n-electrode 400 via a bonding ball formed of Au.

It should be noted that the diameter of the p-side bonding wire 51 and the n-side bonding wire 52 to be used is of the order of 10 μm to 30 μm.

As shown in FIG. 2, in the present exemplary embodiment, in the case where the semiconductor light-emitting element 1 is viewed from the side facing the p-side connecting surface 333, the semiconductor light-emitting element 1 has a structure in which the p-side second metal layer 332, the p-side first metal layer 331, the p-side barrier layer 320, the p-side joining layer 310 and the transparent conductive layer 170 are laminated in order. Accordingly, when the p-side bonding wire 51 is connected to the p-side connecting surface 333, a force applied to the p-side connecting surface 333 from above is transmitted to the transparent conductive layer 170 through the p-side second metal layer 332, the p-side first metal layer 331, the p-side barrier layer 320 and the p-side joining layer 310.

In the present exemplary embodiment, since the p-side second metal layer 332 has the hardness lower than that of the p-side first metal layer 331, it becomes possible to connect the p-side bonding wire 51 to the p-side connecting surface 333 though the force applied in bonding to the p-side connecting surface 333 is reduced compared to the case where the p-side second metal layer 332 has the hardness higher than that of the p-side first metal layer 331. Consequently, the force transmitted to the p-side barrier layer 320, the p-side joining layer 310 and the transparent conductive layer 170 as the bonding is performed can be further reduced, and thereby it becomes possible to further suppress cracks in the transparent conductive layer 170 and separation of the p-side joining layer 310 and the p-side barrier layer 320 that are caused as the bonding is performed.

Similarly, in the present exemplary embodiment, since the n-side second metal layer 432 has the hardness lower than that of the n-side first metal layer 431, it becomes possible to connect the n-side bonding wire 52 to the n-side connecting surface 433 though the force applied in bonding to the n-side connecting surface 433 is reduced compared to the case where the n-side second metal layer 432 has the hardness higher than that of the n-side first metal layer 431. Consequently, the force transmitted to the n-side barrier layer 420, the n-side joining layer 410 and the semiconductor layer exposure surface 140a of the n-type semiconductor layer 140 as the bonding is performed can be further reduced, and thereby it becomes possible to suppress separation of the n-side joining layer 410 and the n-side barrier layer 420 caused as the bonding is performed.

[Second Exemplary Embodiment]

It should be noted that, in both of the first metal layer forming process and the second metal layer forming process of the above-described first exemplary embodiment, the sputtering method is employed to form the first metal layer and the second metal layer that has the hardness lower than that of the first metal layer by changing the sputtering conditions between the first metal layer forming process and the second metal layer forming process. However, the method of carrying out the first metal layer forming process and the second metal layer forming process is not limited thereto.

For example, the first metal layer and the second metal layer that has the hardness lower than that of the first metal layer can be formed by using different methods in the first metal layer forming process and the second metal layer forming process. The following is an example of such methods.

<First Metal Layer Forming Process>

In the first metal layer forming process, Au is used as the sputtering target and sputtering is performed under the Ar gas atmosphere to form the p-side first metal layer 331 on the p-side barrier layer 320 and the n-side first metal layer 431 on the n-side barrier layer 420.

<Second Metal Layer Forming Process>

Subsequently, in the second metal layer forming process, by use of a vapor deposition method with Au as an evaporation material, the p-side second metal layer 332 is formed on the p-side first metal layer 331 and the n-side second metal layer 432 is formed on the n-side first metal layer 431.

Usually, compared to the sputtering method, the hardness of the laminated metal layer becomes low in the vapor deposition method. Accordingly, it is possible to form the second metal layer with the hardness lower than that of the first metal layer by forming the first metal layer by the sputtering method and the second metal layer by the vapor deposition method.

As described above, for example, by using the sputtering method in the first metal layer forming process and using the vapor deposition method in the second metal layer forming process, the second metal layer having the hardness lower than that of the first metal layer can be formed.

[Third Exemplary Embodiment]

Further, in the first exemplary embodiment and the second exemplary embodiment, the p-side bonding layer 330 of the p-electrode 300 has a two-layer structure including the p-side first metal layer 331 and the p-side second metal layer 332, and the n-side bonding layer 430 of the n-electrode 400 has a two-layer structure including the n-side first metal layer 431 and the n-side second metal layer 432, however, the structures of the p-side bonding layer 330 and the n-side bonding layer 430 according to the present invention are not limited thereto. Hereinafter, the third exemplary embodiment according to the present invention will be described.

The semiconductor light-emitting element 1 of the third exemplary embodiment has the same configuration as the semiconductor light-emitting element 1 shown in FIGS. 1 and 2 except for configurations of the p-side bonding layer 330 of the p-electrode 300 and the n-side bonding layer 430 of the n-electrode 400.

The p-side bonding layer 330 of the p-electrode 300 in the semiconductor light-emitting element 1 according to the third exemplary embodiment is composed of Au or an alloy containing Au, and configured with a single continuous metal layer. Specifically, the p-side bonding layer 330 is formed so that the hardness is gradually reduced from the side thereof in contact with the p-side barrier layer 320 toward the top surface exposed to the outside.

Accordingly, the top surface of the p-side bonding layer 330 has the hardness lower than that on the side of the p-side bonding layer 330 in contact with the p-side barrier layer 320. Consequently, it becomes possible to make the adhesive properties between the bonding wire and the p-side bonding layer 330 excellent.

Further, of the p-side bonding layer 330, on the side in contact with the p-side barrier layer 320 has the hardness higher than that on the top surface side of the p-side bonding layer 330. Consequently, it becomes possible to increase joint strength of the p-side bonding layer 330 to the p-side barrier layer 320.

Next, description will be given to an example of the method of producing the semiconductor light-emitting element 1 in the present exemplary embodiment.

The semiconductor light-emitting element 1 in the present exemplary embodiment can be produced by a method similar to the methods of producing the semiconductor light-emitting element 1 in the above-described exemplary embodiments except for the first metal layer forming process (step 3c) and the second metal layer forming process (step 3d) in the electrode forming process (step 3). In other words, in the present exemplary embodiment, the p-side bonding layer 330 and the n-side bonding layer 430 as described above are formed by performing the first metal layer forming process (step 3c) and the second metal layer forming process (step 3d) as a bonding layer forming process, which is a single process. Hereinafter, the bonding layer forming process of the semiconductor light-emitting element 1 in the present exemplary embodiment will be described.

In the bonding layer forming process in the present exemplary embodiment, the p-side bonding layer 330 is formed on the p-side barrier layer 320 and the n-side bonding layer 430 is formed on the n-side barrier layer 420 by performing sputtering with the sputtering conditions being gradually varied. Sputtering is performed by use of Au as the sputtering target under the Ar gas atmosphere.

In the present exemplary embodiment, in the bonding layer forming process, the bonding layer is formed by performing sputtering while gradually increasing gas pressure in the chamber of the sputtering device. Consequently, the p-side bonding layer 330 is formed so that the hardness is gradually reduced from the side thereof that is in contact with the p-side barrier layer 320 toward the top surface thereof that is exposed to the outside, and the n-side bonding layer 430 is formed so that the hardness is gradually reduced from the side thereof that is in contact with the n-side barrier layer 420 toward the top surface thereof that is exposed to the outside.

Here, in the present exemplary embodiment, the gas pressure in the chamber of the sputtering device as the sputtering conditions is gradually varied in the bonding layer forming process, however, the way of changing the sputtering conditions is not limited thereto. For example, the bonding layer may be formed so that the hardness is gradually reduced from the side thereof that is in contact with the barrier layer toward the top surface thereof that is exposed to the outside by gradually varying conditions in sputtering such as the heating temperature of the substrate 110 and the amount of applied voltage.

It should be noted that, in the first to third exemplary embodiments, the p-side bonding layer 330 is formed on the p-side barrier layer 320; however, for example, another conductive layer or the like may be formed between the p-side bonding layer 330 and the p-side barrier layer 320. In the same way, though the n-side bonding layer 430 is formed on the n-side barrier layer 420, for example, another conductive layer or the like may be formed between the n-side bonding layer 430 and the n-side barrier layer 420.

Moreover, in the first to third exemplary embodiments, description has been given with an example of the case where a first conduction type is the n-type in which an electron is a carrier and a second conduction type is the p-type in which a hole is a carrier, however, the present invention is not limited thereto. In other words, the first conduction type may be the p-type in which a hole is a carrier and the second conduction type may be the n-type in which an electron is a carrier.

Further, in the first to third exemplary embodiments, description has been given with an example of a layer composed of the group III nitride semiconductor as the laminated semiconductor layer 100; however, the scope of the present invention is not limited thereto. The present invention can be applied to any compound semiconductor, such as the group III-V compound semiconductor and the group II-VI compound semiconductor.

EXAMPLES

Next, Examples of the present invention will be described, but the present invention is not limited thereto.

The inventors of the present invention produced the semiconductor light-emitting element 1 with configuration of the p-side bonding layer 330 and production conditions of the p-side first metal layer 331 and the p-side second metal layer 332 being changed, and evaluated the p-electrode 300.

<Preparation of Semiconductor Light-emitting Element>

Example 1

As shown below, the group III nitride semiconductor light-emitting element having a light-emitting element portion including a gallium nitride-based compound semiconductor was prepared.

First, as shown in FIG. 2, on the substrate 110 composed of a sapphire single crystal in which C-plane is a principal face, the base layer 130 made of undoped GaN and having a thickness of 4 μm was formed with the intermediate layer 120 composed of AlN interposed therebetween. Next, after the n-contact layer composed of Si-doped (concentration of $1\times10^{19}/cm^3$) GaN with a thickness of 2 μm and the n-cladding layer composed of Si-doped (concentration of $1\times10^{18}/cm^3$) $In_{0.1}Ga_{0.9}N$ with a thickness of 12.5 nm were formed (the n-type semiconductor layer 140 is configured with the n-contact layer and the n-cladding layer), the barrier layer composed of GaN with a thickness of 16 nm and the well layer composed of $In_{0.2}Ga_{0.8}N$ with a thickness of 2.5 nm were alternately laminated five times, and finally the barrier layer was provided to thereby form the light-emitting layer 150 having a multiple quantum well structure. Subsequently, the p-cladding layer composed of Mg-doped (concentration of $1\times10^{20}/cm^3$) $Al_{0.07}Ga_{0.93}N$ with a thickness of 2.5 nm and the p-contact layer composed of Mg-doped (concentration of $8\times10^{19}/cm^3$) GaN with a thickness of 0.15 μm were laminated in this order (the p-type semiconductor layer 160 is configured with the p-contact layer and the p-cladding layer) to form an epitaxial layer composed of the group III nitride semiconductor.

It should be noted that lamination of the gallium nitride-based compound semiconductor layer was performed by the MOCVD method under normal conditions that are well known in this technical field. However, lamination of the intermediate layer 120 composed of AlN was performed by the sputtering method.

Next, prior to forming the transparent conductive layer 170, a part of the n-contact layer of the n-type semiconductor layer 140 was exposed by performing patterning by a known method of photolithography and performing etching of a part of the laminated semiconductor layer 100 in a predetermined region, and thereby the semiconductor layer exposure surface 140*a* was formed.

Next, the transparent conductive layer 170 composed of IZO was formed on a predetermined position of the p-contact layer of the epitaxial layer using a known photolithographic method.

Next, using a known photolithographic method, the p-electrode 300 having a Ta/Pt/Au/Ta-layer structure was formed on the transparent conductive layer 170 and the n-electrode 400 having a Ta/Pt/Au/Ta-layer structure was formed on the semiconductor layer exposure surface 140*a* where the n-contact layer was exposed.

Specifically, the p-side joining layer 310 composed of Ta with a thickness of 40 nm was formed on the transparent conductive layer 170 and the n-side joining layer 410 composed of Ta with a thickness of 40 nm was formed on the semiconductor layer exposure surface 140*a* by the sputtering method under the Ar atmosphere. Next, the p-side barrier layer 320 composed of Pt with a thickness of 100 nm was formed on the p-side joining layer 310 and the n-side barrier layer 420 composed of Pt with a thickness of 100 nm was formed on the n-side joining layer 410 by the sputtering method under the Ar atmosphere.

Next, the p-side first metal layer 331 composed of Au with a thickness of 1000 nm was formed on the p-side barrier layer 320 and the n-side first metal layer 431 composed of Au with a thickness of 1000 nm was formed on the n-side barrier layer 420 by the sputtering method under the Ar atmosphere with gas pressure of 0.3 Pa.

Subsequently, by the sputtering method with the gas pressure of Ar being varied to 2.3 Pa, the p-side second metal layer 332 composed of Au with a thickness of 100 nm was formed on the p-side first metal layer 331 and the n-side second metal layer 432 composed of Au with a thickness of 100 nm was formed on the n-side first metal layer 431.

Further subsequently, the p-side adhesive layer 340 composed of Ta with a thickness of 10 nm was formed on the p-side second metal layer 332 and the n-side adhesive layer 440 composed of Ta with a thickness of 10 nm was formed on the n-side second metal layer 432 by sputtering under the Ar atmosphere.

Next, after the protecting layer 180 was formed, the protecting layer 180, except for the portions where the p-side connecting surface 333 and the n-side connecting surface 433 were to be formed, was covered with a resist by a known photolithographic method, and etching was performed on the protecting layer 180 and the adhesive layer (the p-side adhesive layer 340 and the n-side adhesive layer 440) of these excepted portions to expose part of each of the p-side second metal layer 332 and the n-side second metal layer 432.

Next, after the substrate 110 composed of the sapphire single crystal was made into a thin plate by lapping and polishing the substrate back surface, the thin plate was divided to obtain the group III nitride semiconductor light-emitting element (the semiconductor light-emitting element 1).

The LED characteristics of the semiconductor light-emitting element 1 obtained in Example 1 is as follows: the light emission wavelength was 453 nm and the light emission output was 18.2 mW when the voltage Vf was 3.13V.

Examples 2 to 9, Comparative examples 1 to 4

Next, the semiconductor light-emitting element 1 was produced with the formation conditions of the p-side first metal layer 331 and the p-side second metal layer 332 constituting the p-electrode 300 being changed.

FIG. 6 shows the configuration of the p-side bonding layer 330 and the formation conditions of the p-side first metal layer 331 and the p-side second metal layer 332 (material, formation method, gas pressure of Ar in sputtering and the layer thickness) in Examples 1 to 9 and Comparative examples 1 to 4. In the Examples 1 to 9 and Comparative examples 1 to 4, the p-side bonding layer 330 was formed so that the thickness of the p-side bonding layer 330 (the thickness which is an addition of the thickness of the p-side first metal layer 331 and the thickness of the second metal layer 332) became 1100 nm.

Further, in Comparative examples 1 to 4, of the p-side first metal layer 331 and the p-side second metal layer 332 constituting the p-side bonding layer 330, only the p-side first metal layer 331 is formed, but the p-side second metal layer 332 is not formed. In other words, in the p-side bonding layer 330 in Comparative examples 1 to 4, the Au layer has a single-layer structure.

On the other hand, the p-side bonding layer 330 in Examples 1 to 9, the p-side bonding layer 330 has a two-layer structure in which the p-side second metal layer 332 formed under the formation conditions that are different from the Comparative example 1 is laminated on the p-side first metal layer 331 formed under the same formation conditions as the Comparative example 1. In particular, in Examples 1 and 5, the p-side bonding layer 330 has a configuration in which the p-side second metal layer 332 formed under the same formation conditions as Comparative example 2 is laminated on the p-side first metal layer 331 formed under the same formation conditions as Comparative example 1. In similar way, in Examples 4 and 8, the p-side bonding layer 330 has a configuration in which the p-side second metal layer 332 formed under the same formation conditions as Comparative example 3 is laminated on the p-side first metal layer 331 formed under the same formation conditions as Comparative example 1. Moreover, in Example 9, the p-side bonding layer 330 has a configuration in which the p-side second metal layer 332 formed under the same formation conditions as Comparative example 4 is laminated on the p-side first metal layer 331 formed under the same formation conditions as Comparative example 1.

Figure 5C:
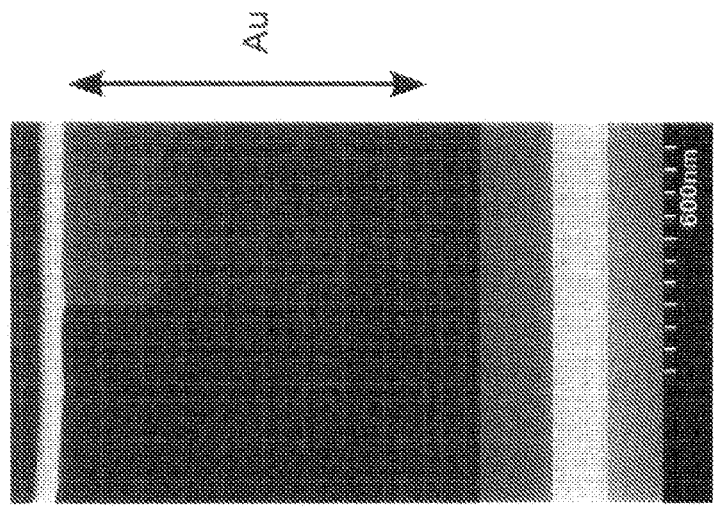
FIGS. 5A to 5C are cross-sectional STEM photographs showing p-electrodes in Comparative examples 1 to 3.
Figure 5B:
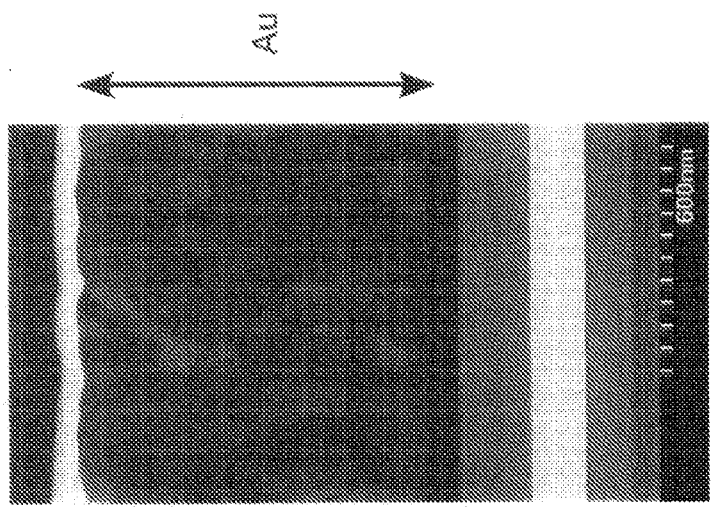
Figure 5A:
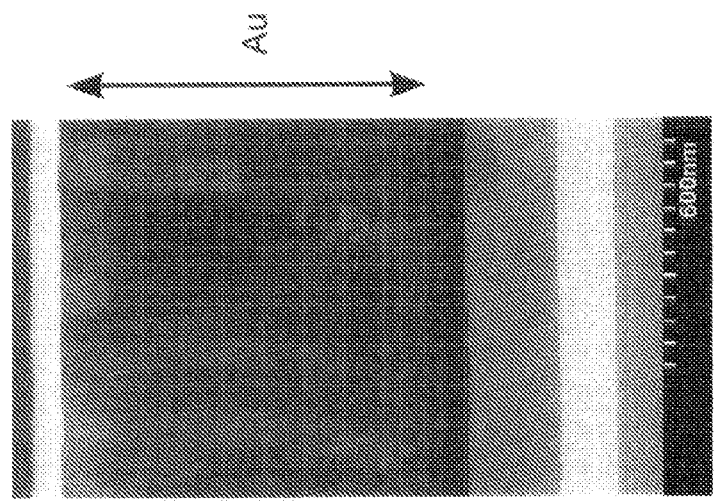

FIGS. 5A to 5C are photographs of the p-electrode 300 in Comparative examples 1 to 3 taken with the scanning transmission electron microscope (STEM). FIG. 5A is an STEM photo of the p-electrode 300 in Comparative example 1, FIG. 5B is an STEM photo of the p-electrode 300 in Comparative example 2, and FIG. 5C is an STEM photo of the p-electrode 300 in Comparative example 3.

In the Au layer (p-side first metal layer 331) in FIG. 5A, it was observed that columnar crystals with a width of the order of 300 nm to 500 nm were formed. Further, in comparison with Au layers of the FIGS. 5B and 5C, the surface of the Au layer in FIG. 5A is flat.

On the other hand, in FIG. 5B, the columnar crystals as shown in FIG. 5A did not appear, but formation of the crystal grains with the size of the order of 100 nm to 300 nm was observed. These crystal grains are not regularly formed, but have random cluster shape. The surface of the Au layer in FIG. 5B has low smoothness in comparison with the Au layer in FIG. 5A and has significant unevenness in reflection of the structure of the crystal grains with random cluster shape.

Here, in the case where the Au layer is formed by sputtering, the higher the gas pressure in the chamber of the sputtering device, the lower the orientation of crystals forming the Au layer. Accordingly, in the case of Comparative example 1 in which the gas pressure in the chamber of the sputtering device is low, as in the Au layer shown in FIG. 5A, a columnar structure with high degree of crystal orientation was observed. On the other hand, in the case of Comparative example 2 in which the gas pressure is higher than that in Comparative example 1, as in the Au layer shown in FIG. 5B, a cluster-shaped structure in which plural crystal grains that differ in orientation were randomly laminated was observed.

Further, in general, in the case where the Au layer is formed by sputtering, the higher the gas pressure in the chamber of the sputtering device, the smaller the size of the crystal grains forming the Au layer.

Accordingly, in the case where the Au layer is formed by sputtering, if the gas pressure in the chamber of the sputtering device is increased, along with deterioration of crystal orientation, crystal grains that differ in orientation are randomly laminated to deteriorate smoothness of the surface of the Au layer. When the gas pressure in the chamber is further increased to make the gas pressure higher than a certain value, along with reduction of the size of the crystal grains forming the Au layer, the smoothness of the surface of the Au layer is improved. It should be noted that the smoothness of the surface of the Au layer can be evaluated by roughness measurement by AFM, which will be described later.

Further, in the Au layer shown in FIG. 5C, it was observed that the size of the crystal grains was large compared to those in the Au layers shown in FIGS. 5A and 5B. Moreover, these crystal grains are not formed regularly, but show random cluster shape. In reflection of the structure of the crystal grains with random cluster shape, the surface of the Au layer in FIG. 5C has significant unevenness compared to the Au layer shown in FIG. 5A.

From above, it can be said that the p-side bonding layer 330 in Examples 1 to 9 has a structure in which the p-side second metal layer 332 with a laminated structure of random cluster-shaped crystals is formed on the p-side first metal layer 331 with a laminated structure of columnar crystals.

<Evaluation Method of p-electrode in Semiconductor Light-emitting Element>

Subsequently, evaluation of the p-electrode 300 in the semiconductor light-emitting element obtained in Examples 1 to 9 and Comparative examples 1 to 4 was performed. The evaluation of the p-electrode 300 was performed by surface visual inspection, AFM evaluation and wire bonding evaluation. First, each evaluation method will be described.

In the first place, description will be given to the surface visual inspection of the p-electrode 300.

The surface visual inspection was performed based on microscope photographs of the top surface of the p-electrode 300.

FIGS. 7A to 7E are examples of the microscope photographs of the top surface of the p-electrode 300 in Example 1 and Comparative examples 1 to 4. FIG. 7A shows the p-electrode 300 in Example 1, FIG. 7B shows the p-electrode 300 in Comparative example 1, FIG. 7C shows the p-electrode 300 in Comparative example 2, FIG. 7D shows the p-electrode 300 in Comparative example 3, and FIG. 7E shows the p-electrode 300 in Comparative example 4.

In FIGS. 7A and 7C to 7E, by comparing Example 1 with Comparative examples 2 to 4, it was learned that, while many bright spots were generated on the top surface of the p-electrode 300 in Comparative examples 2 to 4 compared to Example 1, few bright spots were generated on the top surface of the p-electrode 300 in Example 1 compared to Comparative examples 2 to 4. These bright spots are caused by unevenness occurred on the top surface of the p-electrode 300. Consequently, it was confirmed that occurrence of unevenness on the top surface of the p-electrode 300 was able to be suppressed in Example 1 in comparison with Comparative examples 2 to 4.

On the other hand, when Example 1 and Comparative example 1 are compared in FIGS. 7A and 7B, it was learned that few bright spots were generated on the top surface of the p-electrode 300 in both cases. Accordingly, in Example 1, even in the case where the p-side second metal layer 332 that had the hardness lower than that of the p-side first metal layer 331 was laminated on the p-side first metal layer 331, it was confirmed that occurrence of unevenness on the top surface of the p-electrode 300 was able to be suppressed at the same level as Comparative example 1.

In the surface visual inspection of the p-electrode 300, evaluation was performed by the extent of the bright spots generated on the top surface of the p-electrode 300 based on the microscope photographs of the top surface of the p-electrode 300. Specifically, Example 1 shown in FIG. 7A and Comparative example 1 shown in FIG. 7B were evaluated as A, Comparative example 2 shown in FIG. 7C and Comparative example 3 shown in FIG. 7D were evaluated as B, and Comparative example 4 shown in FIG. 7E was evaluated as C. It should be noted that A and B indicate that the degree of unevenness is evaluated to be within an allowable range, while C indicates that the degree of unevenness is evaluated to be out of the allowable range. Evaluation was also performed on Examples 2 to 9 by the same method.

Subsequently, description will be given to nanoindentation measurement by AFM and surface roughness measurement.

In the nanoindentation measurement, a depth of a dent formed in the case where a needle was pressed against the top surface (p-side connecting surface 333) of the p-electrode 300 at a load of 60 μN was measured. It should be noted that the deeper dent depth indicates the lower hardness.

The surface roughness measurement was conducted in a mode called a tapping mode in which a probe was subjected to forced oscillation with high frequency to scan a surface of a test piece, and thereby uneven shape of the surface was measured in three dimensions based on fluctuations in oscillation amplitude. Then, based on the obtained three-dimensional image, an average surface roughness Ra (nm) was measured as a roughness value.

Next, wire bonding evaluation will be described.

In the wire bonding evaluation, bonding of the bonding wire to the p-side connecting surface 333 in the p-electrode 300 of the semiconductor light-emitting element 1 was performed to evaluate adhesive properties between the p-electrode 300 and the bonding wire and adhesive properties between the p-electrode 300 and the transparent conductive layer 170.

The evaluation was performed by carrying out the wire bonding on 20,000 semiconductor light-emitting elements with conditions including constant ultrasonic output, constant application time and a load of 30 gw, and inspecting how often electrode peeling in which the p-electrode 300 was peeled from the transparent conductive layer 170 and poor adhesion in which the bonding wire was separated from the p-electrode 300 occurred. It should be noted that, in setting of wire bonding conditions, electrode peeling occurred in at least one out of 100 semiconductor light-emitting elements in each of the conditions of constant ultrasonic output, constant application time and load of 60 gw, and therefore, when the load was halved to 30 gw, electrode peeling did not occur in any of the conditions.

<Evaluation Result of p-electrode in Semiconductor Light-emitting Element>

Subsequently, evaluation results will be described.

FIG. 8 shows relationship among the formation conditions of the p-side first metal layer 331 and the p-side second metal layer 332, the surface visual inspection, the AFM evaluation and the wire bonding evaluation.

From the results of the surface visual inspection, few bright spots appeared on the top surface of the p-electrode 300 in Examples 1 to 8, and slightly appeared in Example 9. On the other hand, in Comparative example 4, many bright spots appeared on the surface of the p-electrode 300 in comparison with Examples 1 to 9.

Accordingly, it was learned that, in Examples 1 to 9, the top surface of the p-electrode 300 was less uneven and had favorable appearance compared to Comparative example 4.

Further, from the results of the wire bonding evaluation, the poor adhesion rate was 0% in Examples 1 to 9, thereby favorable results were obtained.

On the other hand, in Comparative examples 1 to 3, the poor adhesion rate was 1.7% to 2.5%.

In comparing the dent depth in nanoindentation measurement in Examples 1 to 9 and Comparative example 1, the depth was 75 nm to 112 nm in Examples 1 to 9, in which favorable results were obtained by the wire bonding evaluation, and 37 nm in Comparative example 1. Consequently, it was learned that, in Examples 1 to 9, the hardness of the p-side bonding layer 330 was lower than that in Comparative example 1 and the adhesive properties between the wire and the surface of the electrode were favorable compared to Comparative example 1.

In comparing the results of the surface roughness measurement in Examples 1 to 9, Comparative examples 2 and 3, the roughness was 2.6 nm to 3.5 nm in Examples 1 to 9, in which favorable results were obtained by the wire bonding evaluation, 7.1 nm in Comparative example 2, and 4.5 nm in Comparative example 3. Consequently, it was learned that, in Examples 1 to 9, the smoothness of the surface of the p-side bonding layer 330 was favorable compared to Comparative examples 2 and 3, and the adhesive properties between the wire and the surface of the electrode were favorable compared to Comparative examples 2 and 3.

From above, it was confirmed that the p-electrode 300 was available in which the surface of the p-bonding layer 330 had mild unevenness and favorable appearance, and good adhesive properties with the bonding wire due to the soft surface of the p-side bonding layer by making the p-side bonding layer 330 have the two-layer structure of the p-side first metal layer 331 and the p-side second metal layer 332 having the hardness lower than that of the p-side first metal layer 331.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light-emitting element comprising:
a first semiconductor layer that has a first conduction type;
a light-emitting layer that emits light by current flow and is laminated on the first semiconductor layer;
a second semiconductor layer that has a second conduction type and is laminated on the light-emitting layer;
a conductive layer that has conductivity and is laminated on the second semiconductor layer;
a first metal layer that is composed of a metallic material containing Au and is laminated on the conductive layer; and
a second metal layer that is composed of a metallic material containing Au and having an indentation hardness lower than an indentation hardness of the metallic material composing the first metal layer, the second metal layer being laminated on the first metal layer so that a surface thereof opposite to another surface contacting the first metal layer is exposed to outside,
wherein the first metal layer comprises a plurality of crystal grains of a columnar structure and the second metal layer comprises a plurality of crystal grains of a random cluster shape, and
the average size of the crystal grains of the first metal layer is larger than the average size of the crystal grains of the second metal layer.

2. The semiconductor light-emitting element according to claim 1, wherein the first metal layer and the second metal layer are composed of metallic materials having a same constituent element.

3. The semiconductor light-emitting element according to claim 2, wherein both of the first metal layer and the second metal layer are substantially composed of Au.

4. The semiconductor light-emitting element according to claim 3, wherein a thickness of the first metal layer is larger than a thickness of the second metal layer.

5. The semiconductor light-emitting element according to claim 4, wherein the first semiconductor layer is composed of a group III nitride semiconductor in which an electron is a carrier and the second semiconductor layer is composed of a group III nitride semiconductor in which a hole is a carrier.

6. The semiconductor light-emitting element according to claim 5, wherein the conductive layer is a transparent conductive layer that has transparency to the light emitted by the light-emitting layer and is laminated on the second semiconductor layer.

7. The semiconductor light-emitting element according to claim 6, wherein a third metal layer composed of a metallic material having an indentation hardness higher than the indentation hardness of the metallic material composing the first metal layer is laminated between the transparent conductive layer and the first metal layer.

8. The semiconductor light-emitting element according to claim 1, wherein a thickness of the first metal layer is larger than a thickness of the second metal layer.

9. The semiconductor light-emitting element according to claim 1, wherein the first semiconductor layer is composed of a group III nitride semiconductor in which an electron is a carrier and the second semiconductor layer is composed of a group III nitride semiconductor in which a hole is a carrier.

10. The semiconductor light-emitting element according to claim 9, wherein the conductive layer is a transparent conductive layer that has transparency to the light emitted by the light-emitting layer and is laminated on the second semiconductor layer.

11. The semiconductor light-emitting element according to claim 10, wherein a third metal layer composed of a metallic material having an indentation hardness higher than the indentation hardness of the metallic material composing the first metal layer is laminated between the transparent conductive layer and the first metal layer.

12. A light-emitting device comprising:
a semiconductor light-emitting element including:
a first semiconductor layer that has a first conduction type;
a light-emitting layer that emits light by current flow and is laminated on the first semiconductor layer;
a second semiconductor layer that has a second conduction type and is laminated on the light-emitting layer;
a conductive layer that has conductivity and is laminated on the second semiconductor layer;
a first metal layer that is composed of a metallic material containing Au and is laminated on the conductive layer; and
a second metal layer that is composed of a metallic material containing Au and having an indentation hardness lower than an indentation hardness of the metallic material composing the first metal layer, the second metal layer being laminated on the first metal layer so that a surface thereof opposite to another surface contacting the first metal layer is exposed to outside;
a bonding wire bonded to the second metal layer of the semiconductor light-emitting element; and
an electrical power supply member that supplies electrical power to the semiconductor light-emitting element through the bonding wire,
wherein the first metal layer comprises a plurality of crystal grains of a columnar structure and the second metal layer comprises a plurality of crystal grains of a random cluster shape, and
the average size of the crystal grains of the first metal layer is larger than the average size of the crystal grains of the second metal layer.

13. The light-emitting device according to claim 12, wherein both of the first metal layer and the second metal layer are substantially composed of Au, and a thickness of the first metal layer is larger than a thickness of the second metal layer.

14. The light-emitting device according to claim 13, wherein
the semiconductor light-emitting element includes:
other conductive layer that has conductivity and is laminated on the first semiconductor layer;
other first metal layer that is composed of a metallic material containing Au and is laminated on the other conductive layer; and
other second metal layer that is composed of a metallic material containing Au and having an indentation hardness lower than the indentation hardness of the metallic material composing the other first metal layer, the other second metal layer being laminated on the other first metal layer so that a surface thereof opposite to another surface contacting the other first metal layer is exposed to outside, and the light-emitting device further comprises:

other bonding wire bonded to the other second metal layer of the semiconductor light-emitting element; and other electrical power supply member that supplies electrical power to the semiconductor light-emitting element through the other bonding wire.

15. The light-emitting device according to claim 12, wherein the semiconductor light-emitting element includes:

other conductive layer that has conductivity and is laminated on the first semiconductor layer;

other first metal layer that is composed of a metallic material containing Au and is laminated on the other conductive layer; and other second metal layer that is composed of a metallic material containing Au and having an indentation hardness lower than the indentation hardness of the metallic material composing the other first metal layer, the other second metal layer being laminated on the other first metal layer so that a surface thereof opposite to another surface contacting the other first metal layer is exposed to outside, and the light-emitting device further comprises:

other bonding wire bonded to the other second metal layer of the semiconductor light-emitting element; and other electrical power supply member that supplies electrical power to the semiconductor light-emitting element through the other bonding wire.

* * * * *